(12) United States Patent
Song

(10) Patent No.: US 12,336,396 B2
(45) Date of Patent: Jun. 17, 2025

(54) COATING LAYER DISPOSED ON A PLURALITY OF CONDUCTIVE PARTICLES BETWEEN A DISPLAY PANEL AND A PRINTED CIRCUIT BOARD

(71) Applicant: SAMSUNG DISPLAY CO., LTD., Yongin-si (KR)

(72) Inventor: Sang Hyeon Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 644 days.

(21) Appl. No.: 17/555,615

(22) Filed: Dec. 20, 2021

(65) Prior Publication Data
US 2022/0199749 A1 Jun. 23, 2022

(30) Foreign Application Priority Data
Dec. 22, 2020 (KR) .................. 10-2020-0180660

(51) Int. Cl.
| | |
|---|---|
| *H10K 59/131* | (2023.01) |
| *H01L 21/56* | (2006.01) |
| *H01L 23/00* | (2006.01) |
| *H01L 23/31* | (2006.01) |
| *H01L 23/40* | (2006.01) |

(Continued)

(52) U.S. Cl.
CPC ......... *H10K 59/131* (2023.02); *H01L 21/561* (2013.01); *H01L 23/3107* (2013.01); *H01L 23/4012* (2013.01); *H01L 24/25* (2013.01); *H01L 24/73* (2013.01); *H05K 1/147* (2013.01); *H05K 1/189* (2013.01); *H05K 3/3457* (2013.01); *H05K 3/363* (2013.01); *H10K 59/1201* (2023.02)

(58) Field of Classification Search
CPC .... H10K 59/131; H05K 3/3457; H05K 3/363; H05K 1/147; H05K 1/189; H01L 24/24; H01L 24/25; H01L 24/73; H01L 24/82; H01L 23/3107; H01L 23/4012; H01L 21/561

See application file for complete search history.

(56) References Cited

U.S. PATENT DOCUMENTS

| | | | | |
|---|---|---|---|---|
| 6,059,172 | A * | 5/2000 | Chapman | .......... H01L 23/49816 228/180.22 |
| 6,369,451 | B2 * | 4/2002 | Lin | ...................... B23K 3/0623 257/E21.511 |

(Continued)

FOREIGN PATENT DOCUMENTS

| | | |
|---|---|---|
| JP | 2003-080694 | 3/2003 |
| KR | 10-1193757 | 10/2012 |

(Continued)

*Primary Examiner* — Alonzo Chambliss
(74) *Attorney, Agent, or Firm* — F. CHAU & ASSOCIATES, LLC

(57) ABSTRACT

A display device includes: a display panel including a plurality of pad electrodes arranged in a first direction; a printed circuit board including a plurality of lead electrodes facing the plurality of pad electrodes, respectively; a plurality of conductive particles disposed between the display panel and the printed circuit board at predetermined intervals; and a coating layer disposed on the plurality of conductive particles and having a thickness varying in the first direction from each of the plurality of lead electrodes toward each of the plurality of pad electrodes.

15 Claims, 21 Drawing Sheets

(51) Int. Cl.
*H05K 1/14* (2006.01)
*H05K 1/18* (2006.01)
*H05K 3/34* (2006.01)
*H05K 3/36* (2006.01)
*H10K 59/12* (2023.01)

(56) References Cited

U.S. PATENT DOCUMENTS

| | | | | |
|---|---|---|---|---|
| 2001/0033009 | A1* | 10/2001 | Inoue | H05K 7/20963 |
| | | | | 257/668 |
| 2009/0178834 | A1* | 7/2009 | Akutsu | H05K 3/323 |
| | | | | 252/500 |
| 2010/0321908 | A1* | 12/2010 | Shiota | H05K 3/323 |
| | | | | 29/832 |
| 2016/0315040 | A1* | 10/2016 | Son | H01L 23/49811 |
| 2018/0067353 | A1* | 3/2018 | Son | H01L 25/18 |
| 2022/0157916 | A1* | 5/2022 | Kwon | H10K 59/131 |

FOREIGN PATENT DOCUMENTS

| | | |
|---|---|---|
| KR | 10-1309319 | 9/2013 |
| KR | 10-2015-0011731 | 2/2015 |
| KR | 10-1844412 | 5/2018 |

* cited by examiner

COATING LAYER DISPOSED ON A PLURALITY OF CONDUCTIVE PARTICLES BETWEEN A DISPLAY PANEL AND A PRINTED CIRCUIT BOARD

CROSS-REFERENCE TO RELATED APPLICATION

This application claims priority under 35 U.S.C. § 119 to Korean Patent Application No. 10-2020-0180660 filed on Dec. 22, 2020 in the Korean Intellectual Property Office, the disclosure of which is incorporated by reference herein in its entirely.

TECHNICAL FIELD

The present invention relates to a display device and a method of manufacturing the same.

DISCUSSION OF THE RELATED ART

The use of display devices is increasing with the development of multimedia. In response to this, various types of display devices such as liquid crystal display (LCD) devices and organic light-emitting display (OLED) devices have been used.

Generally, a small semiconductor chip, referred to as, for example, a display driver integrated circuit, may be used to drive a display panel of the display device. The display driver integrated circuit may be attached to a substrate of the display panel by a method such as a chip-on-glass (COG) method, a chip-on-film (COF) method, a chip-on-plastic (COP) method, or the like.

Typically, the COF method is a method of attaching a thin flexible film, on which the display driver integrated circuit is mounted, to the substrate of the display panel. Conductive particles may be interposed between the display panel and the thin flexible film to electrically connect the display panel to the thin flexible film.

SUMMARY

According to an embodiment of the present invention, a display device includes: a display panel including a plurality of pad electrodes arranged in a first direction; a printed circuit board including a plurality of lead electrodes facing the plurality of pad electrodes, respectively; a plurality of conductive particles disposed between the display panel and the printed circuit board at predetermined intervals; and a coating layer disposed on the plurality of conductive particles and having a thickness varying in the first direction from each of the plurality of lead electrodes toward each of the plurality of pad electrodes.

In an embodiment of the present invention, the plurality of pad electrodes are disposed to be spaced apart from each other by a first pitch in the first direction, and the plurality of conductive particles are disposed only on the plurality of pad electrodes and are spaced apart from each other by a first distance substantially equal to the first pitch, and wherein the plurality of conductive particles are spaced apart from each other by a second distance in a second direction intersecting the first direction.

In an embodiment of the present invention, the plurality of conductive particles are spaced apart from edges of each of the plurality of pad electrodes in the first direction and the second direction.

In an embodiment of the present invention, the coating layer includes a thermosetting acrylic resin.

In an embodiment of the present invention, the coating layer includes at least one of lead or tin.

In an embodiment of the present invention, the thickness of the coating layer disposed on the plurality of conductive particles increases from each of the plurality of lead electrodes toward each of the plurality of pad electrodes.

In an embodiment of the present invention, the thickness of the coating layer disposed on the plurality of conductive particles decreases from each of the plurality of lead electrodes toward each of the plurality of pad electrodes.

In an embodiment of the present invention, the display device further includes a filling member disposed between the plurality of conductive particles.

In an embodiment of the present invention, the display device further includes a flux layer interposed between the coating layer and the filling member.

In an embodiment of the present invention, each of the plurality of conductive particles includes a polymer material and at least one metal layer at least partially surrounding the polymer material.

In an embodiment of the present invention, a plurality of protrusions are formed on an outer surface of each of the plurality of conductive particles.

According to an embodiment of the present invention. A method of manufacturing a display device includes: jetting a plurality of conductive particles and a coating layer on a plurality of pad electrodes disposed on a first substrate, wherein the coating layer is disposed on the plurality of conductive particles; thermally pressing a printed circuit board to the first substrate so that a plurality of lead electrodes of the printed circuit board face the plurality of pad electrodes, respectively, and injecting an underfill resin between the first substrate and the printed circuit board.

In an embodiment of the present invention, the jetting of the plurality of conductive particles and the coating layer includes jetting the plurality of conductive particles and the coating layer only on the plurality of pad electrodes and not jetting the plurality of conductive particles and the coating layer between the plurality of pad electrodes.

In an embodiment of the present invention, the plurality of conductive particles are spaced apart from an edge of each of the plurality of pad electrodes by a first distance in a first direction, and are spaced apart from each other by a second distance in a second direction intersecting the first direction.

In an embodiment of the present invention, the coating layer includes a thermosetting acrylic resin.

In an embodiment of the present invention, the jetting of the plurality of conductive particles includes discharging the plurality of conductive particles one by one from a jetting nozzle.

In an embodiment of the present invention, the jetting of the plurality of conductive particles includes separating an end, from which the conductive particles are discharged, of a jetting nozzle from the plurality of pad electrodes by a first height, wherein the first height is about 100 to about 300 times a diameter of each of the plurality of conductive particles.

According to an embodiment of the present invention, a method of manufacturing a display device includes: applying a resin to a first surface of a first substrate, wherein a plurality of pad electrodes are disposed on the first surface of the first substrate; removing a portion of the resin applied to the first surface of the first substrate; and thermally pressing a printed circuit board to the first substrate, wherein a plurality of conductive particles are disposed on the printed circuit board.

In an embodiment of the present invention, the method further includes, before the thermally pressing of the first substrate, jetting one or more conductive particles coated with a coating layer on a plurality of lead electrodes disposed on the printed circuit board.

In an embodiment of the present invention, the coating layer includes at least one of lead or tin.

BRIEF DESCRIPTION OF THE DRAWINGS

The above and other features of the present invention will become more apparent by describing embodiments thereof in detail with reference to the attached drawings, in which.

DETAILED DESCRIPTION OF THE EMBODIMENTS

Figure 1:
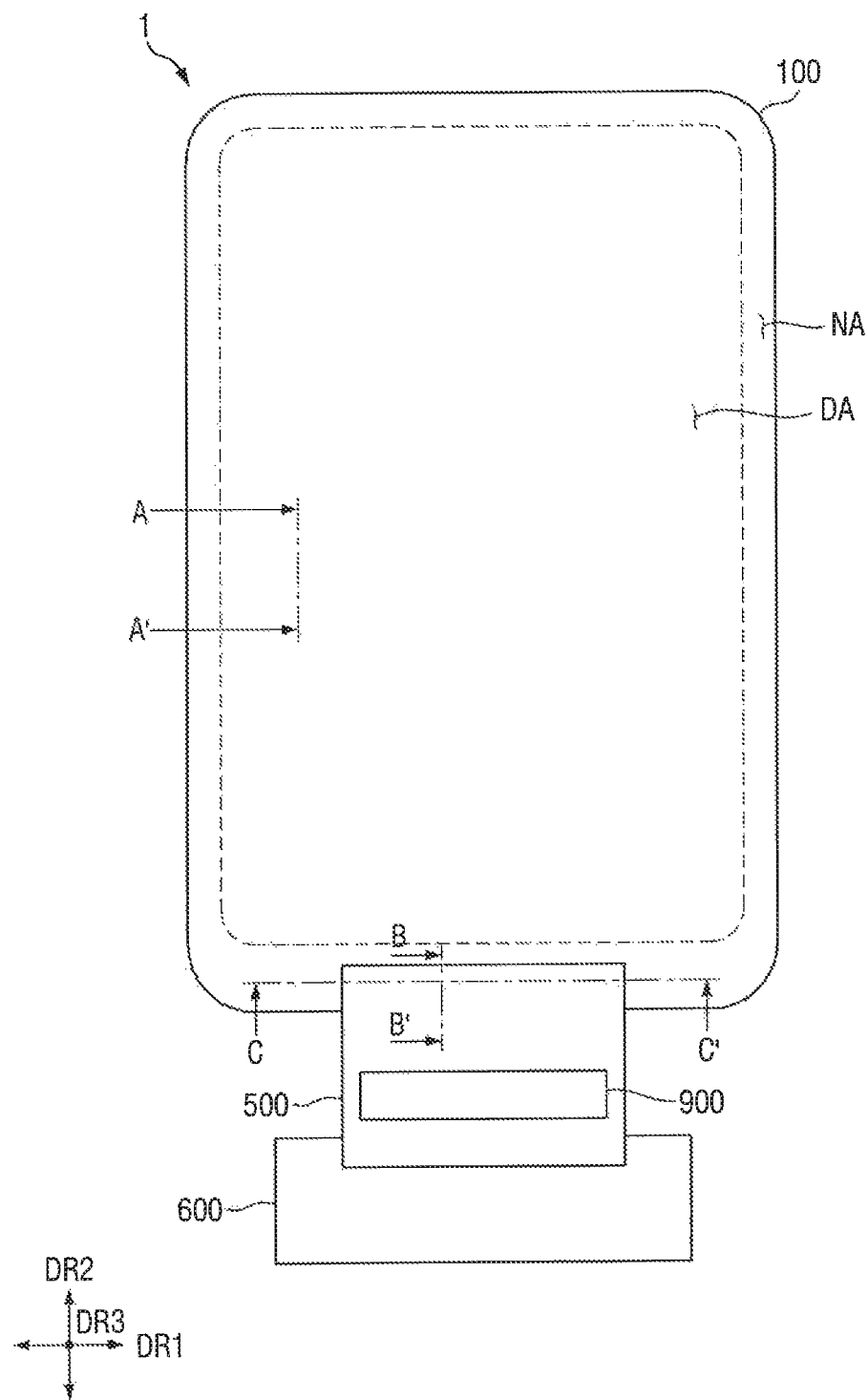
FIG. 1 is a plan view of a display device according to an embodiment of the present invention.

The present invention will now be described more fully hereinafter with reference to the accompanying drawings. This invention may, however, be embodied in different forms and should not be construed as limited to the embodiments set forth herein. The same reference numbers may indicate the same components throughout the specification. In the attached figures, the thickness of layers and regions may be exaggerated for clarity. In other words, since sizes and thicknesses of components in the drawings may be exaggerated for clarity, the following embodiments of the present invention are not limited thereto.

It will also be understood that when a layer is referred to as being "on" another layer or substrate, it can be directly on the other layer or substrate, or intervening layers may be present. In contrast, when an element is referred to as being "directly on" another element, there are no intervening elements present.

Hereinafter, embodiments of the present invention will be described with reference to the accompanying drawings.

Figure 2:
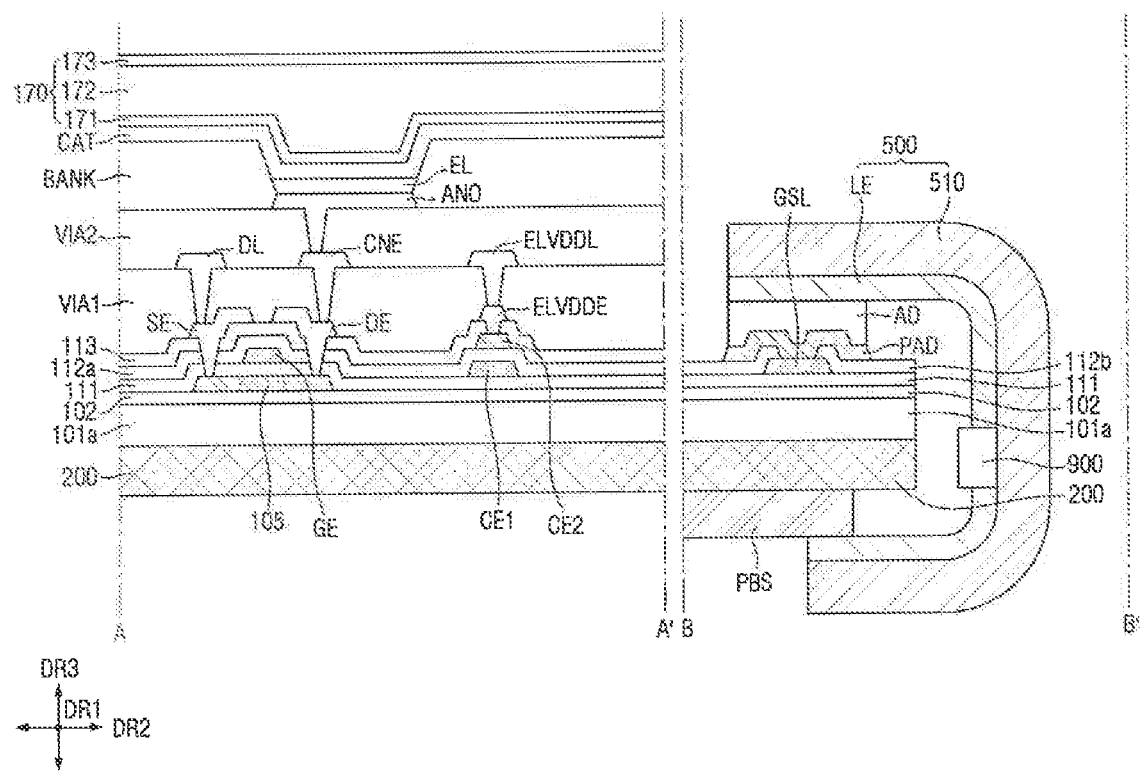
FIG. 2 is a set of cross-sectional views taken along line A-A' and line B-B' of FIG. 1.

FIG. 1 is a plan view of a display device according to an embodiment of the present invention. FIG. 2 is a set of cross-sectional views taken along line A-A' and line B-B' of FIG. 1.

In the following embodiments, a first direction DR1, a second direction DR2, and a third direction DR3 intersect each other and extend in different directions from one another. The first direction DR1, the second direction DR2, and the third direction DR3 may perpendicularly intersect each other. For example, the first direction DR1 may be a transverse direction, the second direction DR2 may be a longitudinal direction, and the third direction DR3 may be a thickness direction. The first direction DR1, the second direction DR2, and/or the third direction DR3 may each include two or more directions. For example, the third direction DR3 may include an upward direction and a downward direction in a cross-sectional view. In this case, one surface of a member disposed to face in the upward direction may be referred to as an upper surface, and the other surface of the member disposed to face in the downward direction may be referred to as a lower surface. However, the directions are illustrative and relative and are not limited to those described above.

A display device 1 is a device for displaying a video or a still image. The display device 1 may include various kinds of products such as a television, a notebook computer, a monitor, digital signage, and an Internet of Things device, as well as portable electronic devices such as a mobile phone, a smartphone, a tablet personal computer (PC), a smart watch, a watch phone, a mobile communication terminal, an electronic organizer, an e-book reader, a portable multimedia player (PMP), a navigation device, and an ultra-mobile PC (UMPC).

Referring to FIG. 1, the display device 1 may include a display panel 100 a printed circuit board 500, and a main circuit board 600 connected to the printed circuit board 500. The display panel 100 is configured to display an image. The printed circuit board 500 is connected to the display panel 100.

For example, an organic light-emitting display panel may be applied as the display panel 100. Hereinafter, the organic light-emitting display panel is implemented in the display panel 100 as an example, but the present invention is not limited thereto. For example, other types of display panels, such as a liquid crystal display (LCD) panel, a quantum dot organic light-emitting diode (QD-OLED) display panel, a quantum dot LCD (QD-LCD) panel, a quantum nano light-emitting display (nano-LED) panel, and a micro light-emitting display (Micro LED) panel, and the like may be applied as the display panel 100.

The display panel 100 includes a display area DA including a plurality of pixel areas and a non-display area NA disposed around the display area DA. For example, the non-display area NA is adjacent to the display area DA.

The display area DA may have, for example, a rectangular shape, in which each corner has a right angle in a plan view, or a rectangular shape, in which each corner is round in a plan view. The display area DA may have short sides and long sides. The short sides of the display area DA may be sides that extend in the first direction DR1. The long sides of the display area DA may be sides that extend in the second direction DR2 and are connected to the short sides. However, a planar shape of the display area DA is not limited to the rectangular shape, and the display area DA may have various shapes such as a circular shape, an elliptical shape, or the like.

For example, the non-display area NA may be disposed adjacent to both short sides and both long sides of the display area DA. In this case, the non-display area NA may surround all sides of the display area DA and be adjacent to an edge of the display area DA. However, the non-display area NA is not limited thereto and may be disposed adjacent to only both short sides or only both long sides of the display area DA.

The printed circuit board 500 may be connected to the non-display area NA of the display panel 100. One side of the printed circuit board 500 may be connected to the display panel 100, and the other side of the printed circuit board 500 may be connected to the main circuit board 600. For example, as shown in FIG. 1, in a plan view, an upper side of the printed circuit board 500 may be attached to a lower short side of the display panel 100, and a lower side of the printed circuit board 500 may be attached to an upper side of the main circuit board 600. However, the printed circuit board 500 is not limited thereto, and may also be attached to an upper short side, a left long side, or a right long side of the display panel 100.

A driver integrated circuit 900 may be disposed on the printed circuit board 500. The driver integrated circuit 900 may include a display driver integrated circuit configured to drive pixels of the display area DA. For example, the driver integrated circuit 900 may be mounted on the printed circuit board 500 by a chip-on-film (COF) method, but the present invention is not limited thereto. For example, the driver integrated circuit 900 may be mounted by a chip-on-glass (COG) method or a chip-on-plastic (COP) method.

The main circuit board 600 is connected to the printed circuit board 500. For example, as shown in FIG. 1, the upper side of the main circuit board 600 may be connected to the lower side of the printed circuit board 500 in a plan view.

Referring to FIG. 2, the printed circuit board 500 may be bent in the third direction DR3, for example, in the downward direction in FIG. 2. The other side of the printed circuit board 500 and the main circuit board connected thereto may be located on a lower surface of a panel lower sheet 200.

The display device 1 may include the panel lower sheet 200 disposed on a lower surface of the display panel 100. The panel lower sheet 200 may be attached to the lower surface of the display panel 100. The panel lower sheet 200 may include at least one functional layer. For example, the functional layer may be a layer that performs a heat dissipation function, an electromagnetic wave shielding function, a grounding function, a buffering function, a strength reinforcing function, a supporting function, a digitizing function, and/or the like. The functional layer may be a sheet layer formed of a sheet, a film layer formed of a film, a thin film layer, a coating layer AD_RS1, a panel, a plate, or the like.

The display panel 100 may include a first substrate 101a, a plurality of conductive layers, a plurality of insulating layers, and an organic layer EL.

The first substrate 101a is disposed on the display area DA and the non-display area NA. For example, the first substrate 101a may be disposed over an entirety of the display area DA and the non-display area NA. The first substrate 101a may perform a function of supporting various elements disposed thereabove. In an embodiment of the present invention, the first substrate 101a may be a rigid substrate including a rigid material such as flexible glass, quartz, or the like. However, the first substrate 101a is not limited thereto, and may be a flexible substrate including a flexible material such as polyimide (PI).

A buffer layer 102 may be disposed on the first substrate 101a. The buffer layer 102 may prevent the penetration of moisture and oxygen from the outside through the first substrate 101a. The buffer layer 102 may include at least one of a silicon nitride ($SiN_x$) film, a silicon oxide ($SiO_2$) film, and/or an oxynitride ($SiO_xN_y$) film.

A semiconductor layer 105 may be disposed on the buffer layer 102. The semiconductor layer 105 forms a channel of a thin-film transistor. The semiconductor layer 105 may be disposed in each pixel of the display area DA and may be disposed even in the non-display area NA in some cases. The semiconductor layer 105 may include a source/drain area and an active area. The semiconductor layer 105 may include, for example, polycrystalline silicon.

A first insulating layer 111 may be disposed on the semiconductor layer 105. The first insulating layer 111 may be disposed on the first substrate 101a. For example, the first insulating layer 111 may be disposed on the entire surface of the first substrate 101a. The first insulating layer 111 may be a gate insulating film having a gate insulating function. The first insulating layer 111 may include, for example, a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. These may be used alone or in combination with each other.

A first conductive layer may be disposed on the first insulating layer 111. The first conductive layer may include a gate electrode GE of a thin-film transistor TFT, a first electrode CE1 of a storage capacitor, and a signal line GSL.

The first conductive layer may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). The first conductive layer may be a single film or a stacked film made of at least one of the above materials.

Second insulating layers 112a and 112b may be disposed on the first conductive layer. The second insulating layers 112a and 112b may insulate the first conductive layer and a second conductive layer from each other. The second insulating layer 112a may be disposed in the display area DA, and the second insulating layer 112b may be disposed in the non-display area NA. For example, the second insulating layer 112b may be disposed in a panel pad area in the non-display area NA. The second insulating layers 112a and 112b may be made of a material from the above materials of the first insulating layer 111.

The second insulating layer 112b may at least partially expose the signal line GSL in the non-display area NA. In FIG. 2, one contact hole is illustrated as being formed in the second insulating layer 112b, but the present invention is not limited thereto, and a plurality of contact holes may be formed.

The second conductive layer may be disposed on the second insulating layers 112a and 112b. The second conductive layer may include a second electrode CE2 of the storage capacitor. A material of the second conductive layer may be selected from the above materials of the first conductive layer. The first electrode CE1 of the storage capacitor and the second electrode CE2 of the storage capacitor may form a capacitor through the second insulating layers 112a and 112b. For example, the second insulating layers 112a and 112b are disposed between the first electrode CE1 and second electrode CE2.

A third insulating layer 113 may be disposed on the second conductive layer. The third insulating layer 113 may include at least one of the above materials of the first insulating layer 111. In an embodiment of the present invention, the third insulating layer 113 may include an organic insulating material. The organic insulating material may be selected from materials of a first via layer VIA1, which will be described below.

A third conductive layer may be disposed on the third insulating layer 113. The third conductive layer may include a source electrode SE, a drain electrode DE, a high-potential voltage electrode ELVDDE, and a pad electrode PAD. The third conductive layer may include at least one among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ii), tantalum (Ta), tungsten (W), and/or copper (Cu). The third conductive layer 140 may be a single film made of a material selected from the above materials. The third conductive layer is not limited thereto and may be a stacked film. For example, the third conductive layer may be formed in a stacked structure of Ti/Al/Ti, Mo/Al/Mo, Mo/AlGe/Mo, Ti/Cu, or the like. In an embodiment of the present invention, the third conductive layer may be formed in a stacked structure of Ti/Al/Ti.

The pad electrode PAD of the third conductive layer may be disposed to overlap the signal line GSL of the first conductive layer in the thickness direction and may be electrically connected to the signal line GSL through contact holes of the second insulating layers 112a and 112b.

An electrical signal for driving the pixel disposed in the display area DA is transmitted through the signal line GSL. The signal line GSL may be electrically connected to at least one of a plurality of conductive layers disposed in the display area DA. In FIG. 2, the signal line GSL is illustrated as being disposed only in the non-display area NA, but the shape or arrangement of the signal line GSL is not limited thereto. The signal line GSL may be disposed over the display area DA and the non-display area NA.

The first via layer VIA1 may be disposed on the third conductive layer. For example, the first via layer VIA1 may be disposed on the source electrode SE, the drain electrode DE, and the high potential voltage electrode ELVDDE. The first via layer VIA1 may include an organic insulating material. The organic insulating material may include at least one among an acrylic-based resin (polyacrylates resin), an epoxy resin, a phenolic resin, a polyamide-based resin, a polyimide-based resin, an unsaturated polyester-based resin, a polyphenylene-based resin (poly phenylenethers resin), a polyphenylenesulfide-based resin, and/or benzocyclobutene (BCB).

In addition, the third insulating layer 113 and the upper structures of the third conductive layer may be removed or omitted in the non-display area NA, in which the pad electrode PAD is disposed, so that the pad electrode PAD is exposed.

A fourth conductive layer may be disposed on the first via layer VIA1. The fourth conductive layer may include a data line DL, a connection electrode CNE, and a high-potential voltage line ELVDDL. The data line DL may be electrically connected to the source electrode SE of the thin-film transistor TFT through a contact hole passing through the first via layer VIA1. The connection electrode CNE may be electrically connected to the drain electrode DE of the thin-film transistor TFT through a contact hole passing through the first via layer VIA1. The high-potential voltage line ELVDDL may be electrically connected to the high-potential voltage electrode ELVDDE through a contact hole passing through the first via layer VIA1. The fourth conductive layer may include a material from the materials of the third conductive layer.

A second via layer VIA2 may be disposed on the fourth conductive layer. The second via layer VIA2 may include at least one of the materials of the first via layer VIA1.

An anode AND is disposed on the second via layer VIA2. The anode AND may be electrically connected to the connection electrode CNE through a contact hole passing through the second via layer VIA2.

A bank layer BANK may be disposed on the anode AND. The bank layer BANK may include a contact hole that exposes at least a portion of the anode AND. The bank layer BANK may be made of an organic insulating material or an inorganic insulating material. For example, the bank layer BANK may include at least one of a photoresist, a polyimide-based resin, an acrylic-based resin, a silicon compound, a polyacrylic-based resin, and the like.

The organic layer EL may be disposed on an upper surface of the anode AND and in an opening of the bank layer BANK. A cathode CAT is disposed on the organic layer EL and the bank layer BANK. The cathode CAT may be a common electrode disposed over a plurality of pixels.

A thin-film encapsulation layer 170 is disposed on the cathode CAT. The thin-film encapsulation layer 170 may cover an organic light-emitting diode (OLED). The thin-film encapsulation layer 170 may be a stacked film in which inorganic films and organic films are alternately stacked. For example, the thin-film encapsulation layer 170 may include a first encapsulation inorganic film 171, an encapsulation organic film 172, and a second encapsulation inorganic film 173, which are sequentially stacked.

The printed circuit board 500 may include a base film 510 and a lead electrode LE. The lead electrode LE may be electrically connected to the pad electrode PAD.

The lead electrode LE may include a metal material. For example, the lead electrode LE may include at least one metal from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu).

An adhesive member AD may be interposed between the lead electrode LE and the signal line GSL. The adhesive member AD may attach and electrically connect the lead electrode LE and the signal line GSL to each other. A detailed configuration of the adhesive member AD will be described below with reference to FIG. 3.

In addition, the stacked structure and shape of each of the signal line GSL and the pad electrode PAD may be modified in the panel pad area of the non-display area NA.

For example, in an embodiment of the present invention, the signal line GSL may include a plurality of patterns, and the pad electrode PAD disposed on the signal line GSL may have an uneven surface based on a stepped portion formed by the signal line GSL.

In an embodiment of the present invention, an auxiliary pad of the second conductive layer may be disposed between the signal line GSL and the pad electrode PAD. In this case, a planar size of the auxiliary pad may be less than a planar size of the pad electrode PAD. The pad electrode PAD, the auxiliary pad, and the signal line GSL may overlap each other in the thickness direction and may be electrically connected to each other.

In an embodiment of the present invention, the signal line GSL may be formed of the second conductive layer, and the pad electrode PAD may be formed of the fourth conductive layer.

Figure 3:
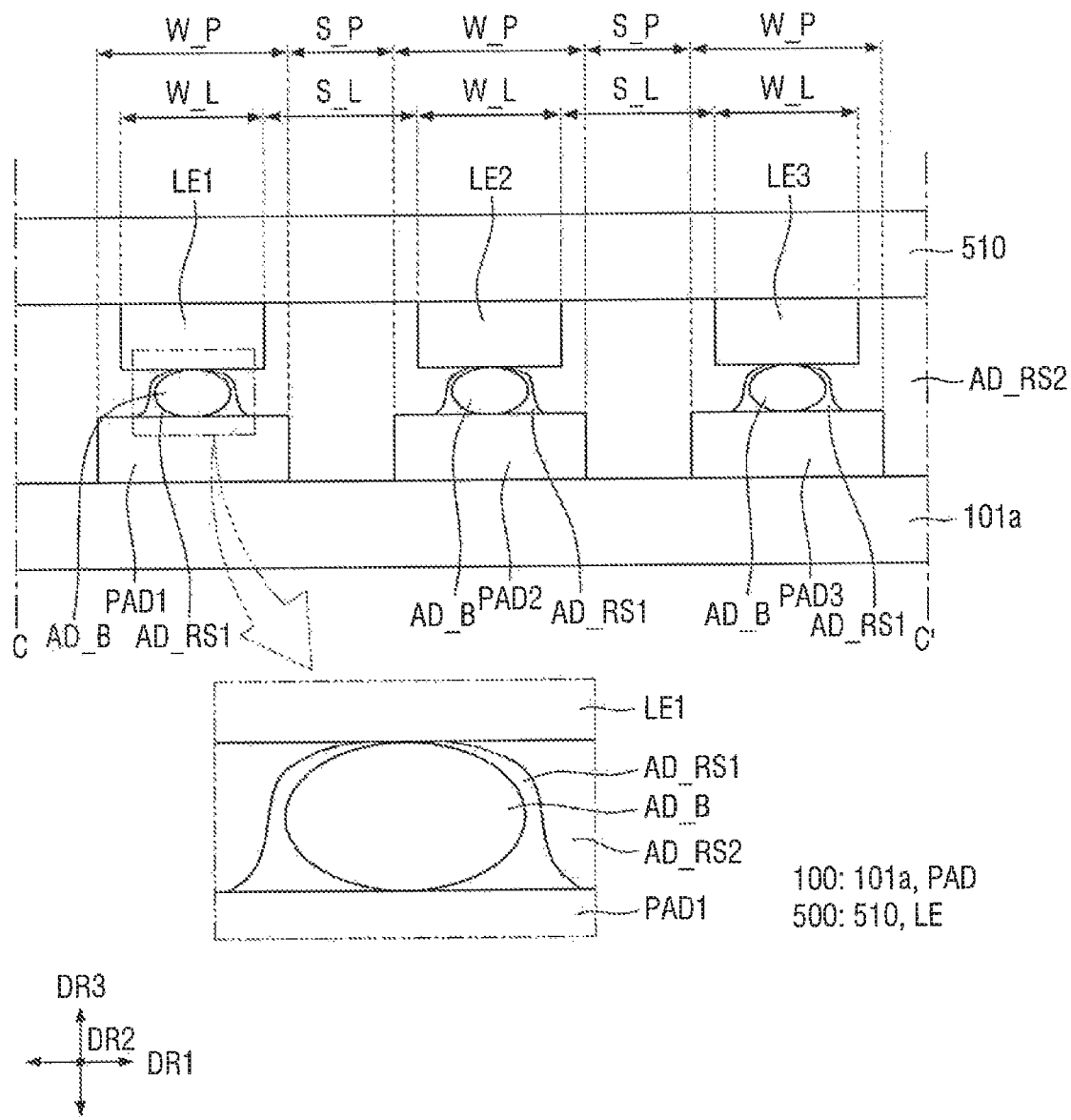
FIG. 3 is a cross-sectional view taken along line C-C' of FIG. 1.

FIG. 3 is a cross-sectional view taken along line C-C' of FIG. 1.

For convenience of description, the components of the display panel 100 other than the first substrate 101a and the pad electrode PAD are not illustrated in FIG. 3.

Referring to FIG. 3, a plurality of pad electrodes PAD may be disposed on one surface of the first substrate 101a, which faces the printed circuit board 500. As shown in FIG. 2, at least one conductive layer and at least one insulating layer may be interposed between the first substrate 101a and the plurality of pad electrodes PAD. The plurality of pad electrodes PAD may be disposed to be exposed upward (e.g., toward a plurality of lead electrodes LE). Although three pad electrodes PAD are illustrated in FIG. 3, the number of the plurality of pad electrodes PAD is not limited thereto.

The plurality of pad electrodes PAD may be disposed to be spaced apart from each other by a first pitch in the first direction DR1 in a cross-sectional view. The first pitch may be the sum of a first width W_P of the pad electrode PAD in the first direction DR1 and a first interval S_P between the pad electrodes PAD in the first direction DR1. The first width W_P may be greater than or equal to the first interval S_P. In an example, the first pitch may have a fine size of about 50 µm or less. In another example, the first pitch may be about 18 µm or less. In another example, the first width W_P may be about 0.7 to about 0.9 times the first interval S_P. In another example, a difference between the first width W_P and the first interval S_P may be in a range of about 1.0 µm to about 3.0 µm. The first interval S_P may be greater than a diameter DD (see FIG. 4) of each of the conductive particles AD_B. In another example, the first pitch may be in a range of about 10 µm to about 30 µm, the first width W_P may be in a range of about 4 µm to about 14 µm, and the first interval S_P may be in a range of about 6 µm to about 16 µm. In another example, the first pitch may be about 20 µm, the first width W_P may be about 9 µm, and the first interval S_P may be about 11 µm.

The plurality of lead electrodes LE may be disposed on one surface of the base film 510, which faces the display panel 100. The plurality of lead electrodes LE may be disposed to respectively face the plurality of pad electrodes PAD. The plurality of lead electrodes LE may be disposed to respectively overlap the plurality of pad electrodes PAD in the thickness direction.

The plurality of lead electrodes LE may be disposed to be spaced apart from each other by a first pitch that is substantially the same as the first pitch of the plurality of pad electrodes PAD. The first pitch may be the sum of a second width W_L of the lead electrode LE in the first direction DR1 and a second interval S_L between the lead electrodes LE in the first direction DR1. The second width W_L may be greater than or equal to the second interval S_L. The second width W_L may be less than the first width W_P. For example, the second width W_L may be about 15 µm or less. However, the second width W_L is not limited thereto and may be equal to or greater than the first width W_P.

The adhesive member AD may be interposed between the display panel 100 and the printed circuit board 500. The adhesive member AD may attach and electrically connect the display panel 100 to the printed circuit board 500.

The adhesive member AD may include a plurality of conductive particles AD_B, the coating layer AD_RS1, and a filling member AD_RS2.

The plurality of conductive particles AD_B may be conductive balls. Hereinafter, a structure of the conductive particles AD_B will be described in detail with reference to FIG. 5.

The plurality of conductive particles AD_B may be disposed in areas in which the plurality of lead electrodes LE and the plurality of pad electrodes PAD overlap each other in the thickness direction. For example, the conductive particles AD_B may each be disposed only between the lead electrode LE and the pad electrode PAD. However, the present invention is not limited thereto, and the plurality of conductive particles AD_B may be disposed in areas in which the plurality of lead electrodes LE and/or the plurality of pad electrodes PAD do not overlap each other in the thickness direction.

The plurality of conductive particles AD_B may not be disposed in a space between the lead electrode LE and another adjacent lead electrode LE and may not be disposed in a space between the pad electrode PAD and another adjacent pad electrode PAD. As a result, a short-circuit phenomenon occurring due to the plurality of conductive particles AD_B flowing into the space between the lead electrodes LE or the space between the pad electrodes PAD may be reduced. However, the present invention is not limited thereto, and the plurality of conductive particles AD_B may be disposed in the space between the lead electrode LE and another adjacent lead electrode LE and may be disposed in the space between the pad electrode PAD and another adjacent pad electrode PAD.

The plurality of conductive particles AD_B may be arranged at the first pitch in the first direction DR1. Accordingly, as shown in FIG. 3, in a cross-sectional view, only one conductive particle AD_B may be disposed between one pad electrode PAD and one lead electrode LE, and the conductive particles AD_B may be arranged in the first direction DR1. For example, as will be described below in FIG. 4, the plurality of conductive particles AD_B may be arranged to form one row (or, e.g., one column) in the second direction DR2 (e.g., a length direction of the pad electrode PAD or the lead electrode LE), but the present invention is not limited thereto.

The conductive particles AD_B may be pressed between the lead electrode LE and the pad electrode PAD such that the conductive particles AD_B have an elliptical shape elongated in left and right directions in a cross-sectional view, but the present invention is not limited thereto. The conductive particles AD_B may each have a width less than the first width W_P and the second width W_L.

The coating layer AD_RS1 may be coated on the conductive particles AD_B to at least partially surround the conductive particles AD_B. The coating layer AD_RS1 may be made of an insulating material. The coating layer AD_RS1 may be made of a thermoplastic resin such as a styrene butadiene resin and a polyvinyl butylene resin, or a thermosetting resin such as an epoxy resin, a polyurethane resin, and an acrylic resin. The coating layer AD_RS1 may also be made of an ultraviolet curable resin such as an epoxy acrylate, a urethane acrylate, an unsaturated polyester resin, a polyester acrylate, a polyether acrylate, or an unsaturated acrylic resin. The coating layer AD_RS1 before curing may have a viscosity of about 500 cps to about 1000 cps at about 25° C. For example, the viscosity of the coating layer AD_RS1 before curing may be about 600 cps. In a jetting process, which will be described below, the positions of the jetted conductive particles AD_B may be fixed on the plurality of lead electrodes LE, the plurality of pad electrodes PAD, and/or the first substrate 101a by an adhesive force of the coating layer AD_RS1 before curing.

The display device 1 may include a flux layer AD_FX (see FIG. 9), which will be described below. Similar to that shown in FIG. 9, the flux layer AD_FX (see FIG. 9) may be disposed to at least partially surround at least a portion of the coating layer AD_RS1, and the jetted conductive particles AD_B may also be fixed by an adhesive force of the flux layer AD_FX (see FIG. 9). In this case, the coating layer AD_RS1 may be made of a metal including at least one of lead and/or tin.

The filling member AD_RS2 may be disposed to fill a space formed between the plurality of pad electrodes PAD, the first substrate 101a (or, e.g., the second insulating layers 112A and 112B of the non-display area NA), the base film 510, and the plurality of lead electrodes LE. The filling member AD_RS2 may be made of an insulating material. The filling member AD_RS2 may be made of a thermoplastic resin such as a styrene butadiene resin and a polyvinyl butylene resin, or a thermosetting resin such as an epoxy resin, a polyurethane resin, and an acrylic resin. The filling member AD_RS2 may also be made of an ultraviolet curable resin such as epoxy acrylate, a urethane acrylate, an unsaturated polyester resin, a polyester acrylate, a polyether acrylate, or an unsaturated acrylic resin.

The coating layer AD_RS1 and the filling member AD_RS2 may be made of the same type of resin, or may be made of different types of resin from each. In an example, the coating layer AD_RS1 and the filling member AD_RS2 may be the same acrylic resin. In another example, the coating layer AD_RS1 may be an acrylic resin and the filling member AD_RS2 may be an epoxy resin. In another example, both the coating layer AD_RS1 and the filling member AD_RS2 may be thermosetting resins. In another example, the coating layer AD_RS1 may be a thermosetting resin and the filling member AD_RS2 may be an ultraviolet curable resin. In another example, each of the coating layer AD_RS1 and the filling member AD_RS2 may include at least one of an ultraviolet curable resin and a thermosetting resin. In another example, the coating layer AD_RS1 and the filling member AD_RS2 may be made of resins having different viscosity.

An interface may be formed between the coating layer AD_RS1 and the filling member AD_RS2. The interface may be an outer surface of the coating layer AD_RS1.

The coating layer AD_RS1 may be formed to a different thickness on the conductive particles AD_B. The thickness may be a distance, in the first direction DR1, from the conductive particle AD_B to the outer surface of the coating layer AD_RS1 or from the conductive particle AD_B to the interface formed between the coating layer AD_RS1 and the filling member AD_RS2. Referring to a lower end portion of FIG. 3, the thickness of the coating layer AD_RS1 in the first direction DR1 may increase as the pad electrode PAD is approached from the lead electrode LE. The thickness of the coating layer AD_RS1 may gradually increase from the lead electrode LE toward the pad electrode PAD. For example, the thickness of the coating layer AD_RS1 in the first direction DR1 may be the largest at the lower portion of the conductive particle AD_B and an upper surface of the pad electrode PAD. The coating layer AD_RS1 may gradually increase in thickness from the lead electrode LE toward the pad electrode PAD, and may include a partial area in which the thickness of the coating layer AD_RS1 is reduced. In an embodiment of the present invention, as shown in the lower end portion of FIG. 3, the thickness of the coating layer AD_RS1 may be maximum at a lower end of the conductive particles AD_B and may be minimum at an upper end of the conductive particles AD_B. For example, the coating layer AD_RS1 may have a maximum thickness and/or a maximum width at the lower end of the conductive particles AD_B adjacent to the pad electrode PAD.

A length of the coating layer AD_RS1 may increase toward the pad electrode PAD. The length may be a width of the coating layer AD_RS1 in the first direction DR1 in a plan view, as shown in FIG. 3. The length may be a width of the coating layer AD_RS1 in the second direction DR2 in a plan view.

The thickness of the coating layer AD_RS1 at an uppermost end portion of the conductive particle AD_B in contact with the lead electrode LE and at a lowermost end portion of the conductive particles AD_B in contact with the pad electrode PAD may be about 0 μm. For example, the coating layer AD_RS1 may not be disposed at points of the conductive particle AD_B that are in contact with the lead electrode LE and the pad electrode PAD, and the conductive particle AD_B may be in direct contact with the lead electrode LE and the pad electrode PAD to electrically connect the lead electrode LE and the pad electrode PAD.

As will be described below, during the manufacture of the display device 1, the conductive particles AD_B may be jetted on the pad electrode PAD in a state of being coated with the coating layer AD_RS1, and the difference in thickness of the coating layer AD_RS1 may be a trace (result) that is formed by the flow of the coating layer AD_RS1 due to gravity before the coating layer AD_RS1 is cured.

Figure 4:
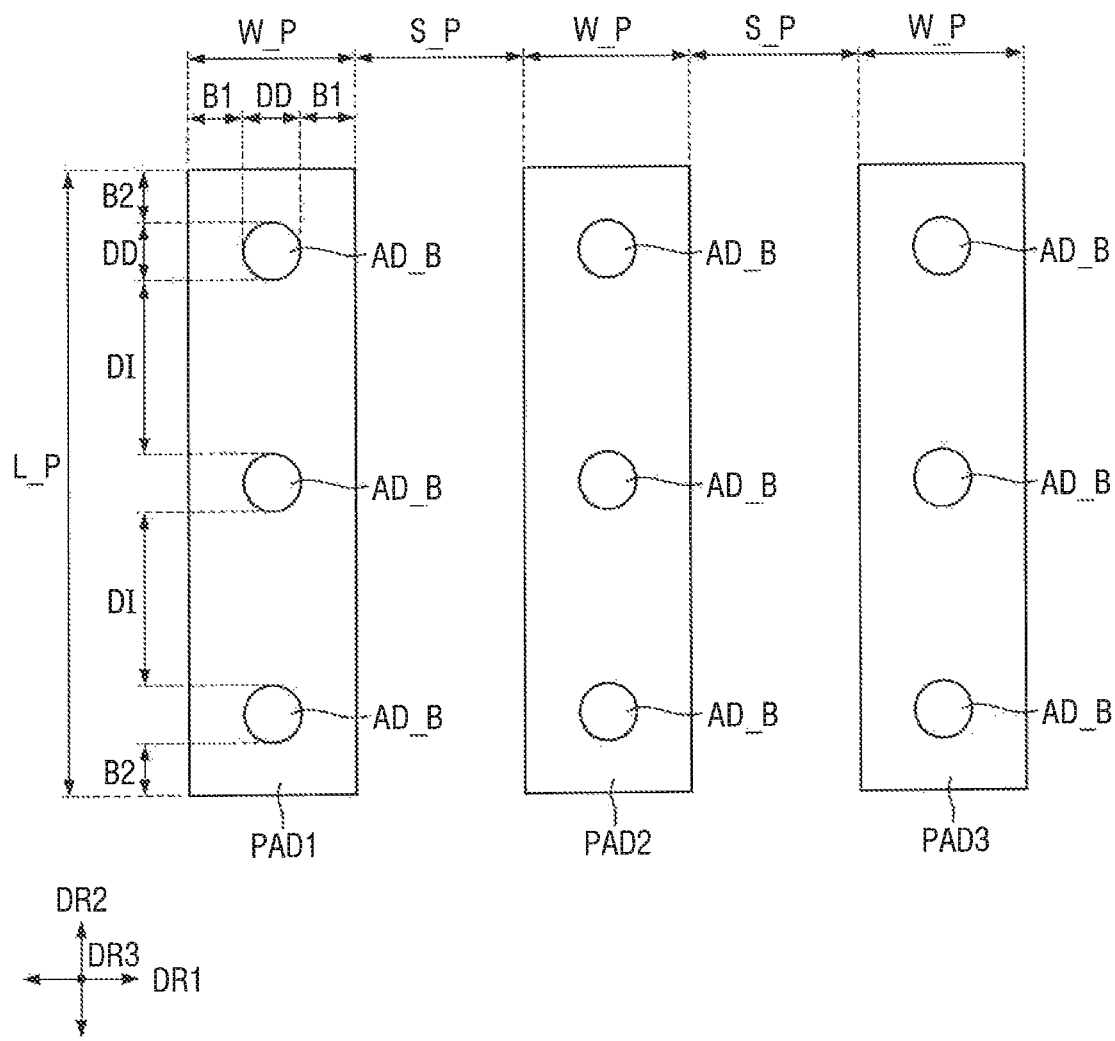
FIG. 4 is a plan layout view of conductive particles of FIG. 3.

FIG. 4 is a plan view illustrating the arrangement of the conductive particles AD_B of FIG. 3.

For convenience of description, the components other than the conductive particles AD_B and the pad electrodes PAD are not illustrated in FIG. 4. Although the plurality of conductive particles AD_B are illustrated in FIG. 4 as being disposed on the plurality of pad electrodes PAD and since the plurality of lead electrodes LE are disposed to face the plurality of pad electrodes PAD, respectively, the plurality of conductive particles AD_B may be disposed on the plurality of lead electrodes LE in a manner substantially the same as or similar to a manner described below.

Referring to FIG. 4, the plurality of pad electrodes PAD may be arranged to be spaced apart from each other by the first pitch in the first direction DR1, and may each extend in the second direction DR2 to have a third width L_P greater than the first width W_P. As described above, the plurality of conductive particles AD_B may be disposed only on the plurality of pad electrodes PAD.

The plurality of conductive particles AD_B may be disposed on the plurality of pad electrodes PAD in a matrix form in a plan view. For example, the plurality of conductive particles AD_B may be disposed on the plurality of pad electrodes PAD such that two or more conductive particles AD_B form one row extending in the second direction DR2 for each pad electrode PAD. The conductive particles AD_B disposed on one pad electrode PAD, and may overlap the conductive particles AD_B, which are disposed on another adjacent pad electrode PAD, in the first direction DR1. For example, in one pad electrode PAD, the conductive particles AD_B may be disposed on a bisector crossing the pad electrode PAD in the second direction DR2.

Since the conductive particles AD_B are disposed to be spaced apart from the other conductive particles AD_B, which are disposed on the adjacent pad electrode PAD, in the first direction DR1 as far as possible, a short circuit caused by the conductive particles AD_B flowing between the pad electrodes PAD may be minimized. Further, since the plurality of conductive particles AD_B are disposed on one pad electrode PAD to form a row in the second direction DR2, even when any one conductive particle AD_B flows between the pad electrodes PAD, the other conductive particles AD_B may maintain an electrical connection between the pad electrode PAD and the lead electrode LE. In FIG. 4, three conductive particles AD_B are disposed on one pad electrode PAD, but the number of the conductive particles AD_B constituting the row on one pad electrode PAD is not limited thereto.

The conductive particles AD_B disposed on one pad electrode PAD may be disposed to have a second pitch in the second direction DR2. The conductive particles AD_B disposed on one pad electrode PAD may be spaced apart from each other and thus may be prevented from flowing together. The second pitch may be the sum of the diameter DD of the conductive particle AD_B and a third interval DI between the conductive particles AD_B in the second direction DR2. The second pitch may be substantially equal to the first pitch. In an example, the second pitch may be about 50 μm or less. In another example, the second pitch may be in a range of about 10 μm to about 30 μm. In another example, the second pitch may be about 20 μm or less.

As described above, the width of the conductive particle AD_B may be less than the first width W_P and the second width W_L. The width of the conductive particle AD_B may be the diameter DD of the conductive particle AD_B. The diameter DD of the conductive particle AD_B may be a diameter in a state in which the conductive particles AD_B are pressed, and may refer to a diameter before the conductive particles AD_B are pressed. In this case, the diameter DD of the conductive particle AD_B may refer to an average diameter or a maximum diameter.

The diameter DD of the conductive particle AD_B may be less than the first interval S_P. The diameter DD of the conductive particle AD_B may be less than or equal to the first width W_P. In an example, the diameter DD of the conductive particle AD_B may be about ¼ to about ½ of the first width W_P and/or the second width W_L. In another example, the diameter DD of the conductive particle AD_B may be about ¼ to about ½ of the first interval S_P and/or the second interval S_L. In another example, the diameter DD of the conductive particle AD_B may be about ¹⁄₁₀ to about ¼ of the first pitch. In another example, the diameter DD of the conductive particle AD_B may be in a range of about 2 μm to about 6 μm.

The conductive particle AD_B may be spaced apart from an edge of the pad electrode PAD by a first separation distance B1 in the first direction DR1 and by a second separation distance B2 in the second direction DR2. The first separation distance B1 may be a distance measured between the long side of the pad electrode PAD extending in the second direction DR2 and the conductive particle AD_B, and the second separation distance B2 may be a distance measured between the short side of the pad electrode PAD extending in the first direction DR1 and the conductive particle AD_B. The first separation distance B1 and/or the second separation distance B2 may be about 0.5 to about 1.5 times the diameter DD of the conductive particle AD_B. Since the conductive particles AD_B are sufficiently separated from the edge of the pad electrode PAD, the short circuit caused by the flow of the conductive particles AD_B may be prevented.

The first separation distance B1 and the second separation distance B2 may be the same as or different from each other. In an example, the first separation distance B1 may be greater than the second separation distance B2, for securing a sufficient separation distance between the plurality of pad electrodes PAD in the first direction DR1 that is a direction in which the plurality of pad electrodes PAD are arranged. In this case, a difference between the first separation distance B1 and the second separation distance B2 may be about 2.0 μm or less. In another example, the second separation distance B2 may be greater than the first separation distance B1.

Figure 5:
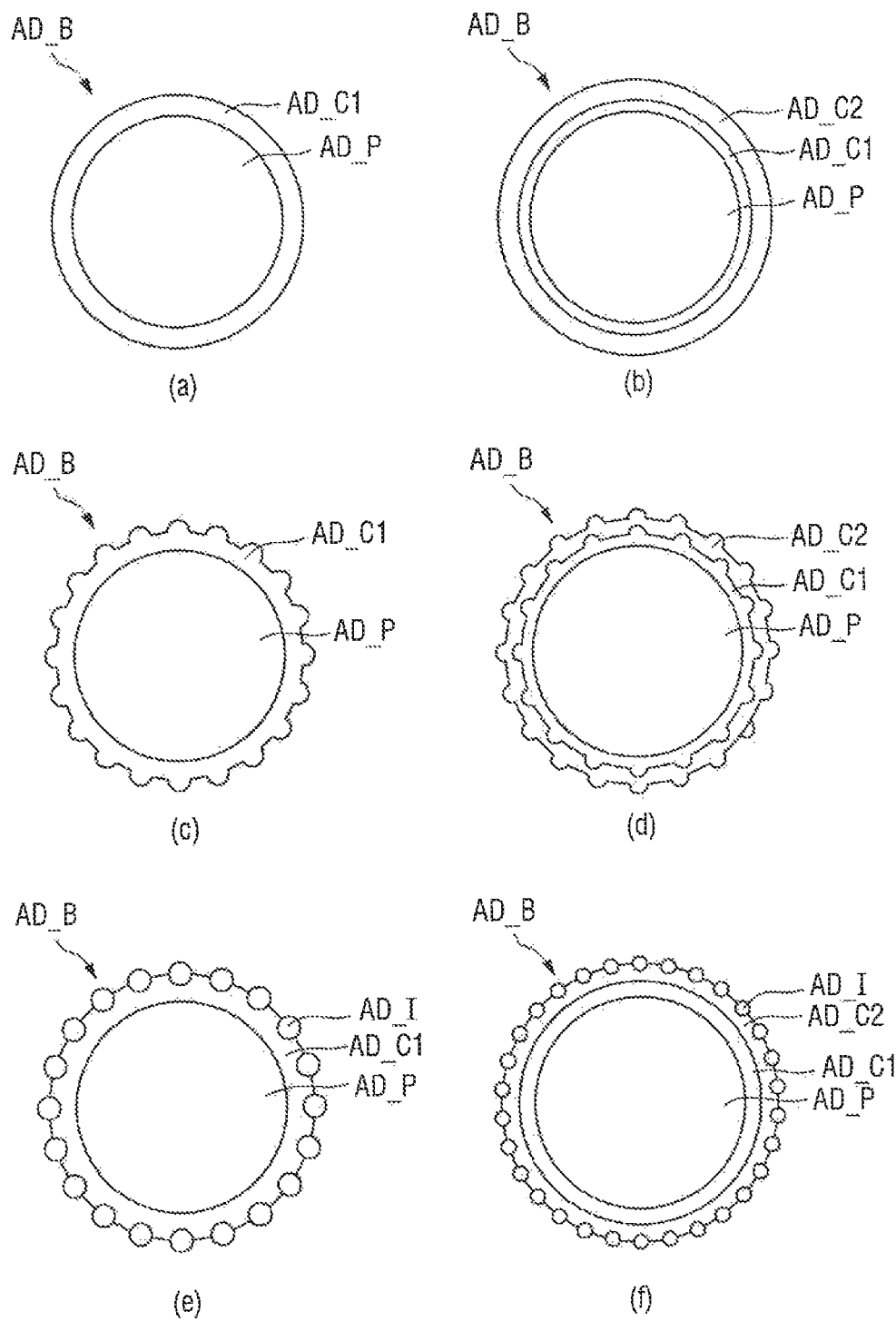
FIG. 5 is a set of cross-sectional views of conductive particles according to an embodiment of the present invention.

FIG. 5 is a set of cross-sectional views of conductive particles AD_B according to an embodiment of the present invention.

In FIGS. 5A to 5F, cross sections of the conductive particles AD_B before being pressed between the lead electrode LE and the pad electrode PAD are illustrated. As shown in FIG. 3, in a state after being pressed, the shape of the conductive particle AD_B and the thickness of each of the layers constituting the conductive particle AD_B may be changed.

Referring to FIG. 5A, in an embodiment of the present invention, the conductive particle AD_B may include a polymer particle AD_P and a first metal layer AD_C1 coated on the polymer particle AD_P. Before the conductive particle AD_B is pressed, the first metal layer AD_C1 may be disposed to a substantially uniform thickness on the polymer particle AD_P. The first metal layer AD_C1 may be formed on the polymer particle AD_P to have a smooth outer surface.

Referring to FIG. 5B, in an embodiment of the present invention, the conductive particle AD_B may include a polymer particle AD_P, a first metal layer AD_C1 coated on the polymer particle AD_P, and a second metal layer AD_C2 coated on the first metal layer AD_C1.

The first metal layer AD_C1 and the second metal layer AD_C2 may be made of different materials from each other. For example, the first metal layer AD_C1 may be made of nickel, and the second metal layer AD_C2 may be made of gold, but the present invention is not limited thereto. In this case, similar to the case in FIG. 5A, an outer surface of the second metal layer AD_C2 may be formed to be substantially smooth.

Referring to FIG. 5C, in an embodiment of the present invention, the conductive particle AD_B may include a polymer particle AD_P and a first metal layer AD_C1, and a plurality of protrusions (or, e.g., uneven portions) may be formed on an outer surface of the first metal layer AD_C1. Since the plurality of protrusions are formed on the outer surface of the first metal layer AD_C1, the conductive particle AD_B may be more stably seated on the pad electrode PAD.

Referring to FIG. 5D, in an embodiment of the present invention, the conductive particle AD_B may include a polymer particle AD_P, a first metal layer AD_C1, and a second metal layer AD_C2. Further, a plurality of protrusions (or, e.g., uneven portions) may be formed on an outer surface of the first metal layer AD_C1, and a plurality of protrusions (or, e.g., uneven portions) may be formed on an outer surface of the second metal layer AD_C2.

Referring to FIG. 5E, in an embodiment of the present invention, the conductive particle AD_B may include a polymer particle AD_P, a first metal layer AD_C1, and a plurality of insulating particles AD_I dispersed on an outer surface of the first metal layer AD_C1. The plurality of insulating particles AD_I may be disposed to surround the outer surface of the first metal layer AD_C1, and may form a plurality of protrusions on an outer surface of the conductive particles AD_B. Accordingly, the conductive particle AD_B may be stably seated on the pad electrode PAD, and at the same time, it is possible to prevent a short circuit occurring when the conductive particle AD_B comes into close contact with another conductive particle AD_B.

Referring to FIG. 5F, in an embodiment of the present invention, the conductive particle AD_B includes a first metal layer AD_I, a first metal layer AD_C2 and a plurality of insulating particles AD_I disposed on the second metal layer AD_C2. In addition, similar to the case in FIG. 5E, when the conductive particle AD_B includes a second metal layer AD_C2, a plurality of insulating particles AD_I may be dispersed on an outer surface of the second metal layer AD_C2.

Figure 6:
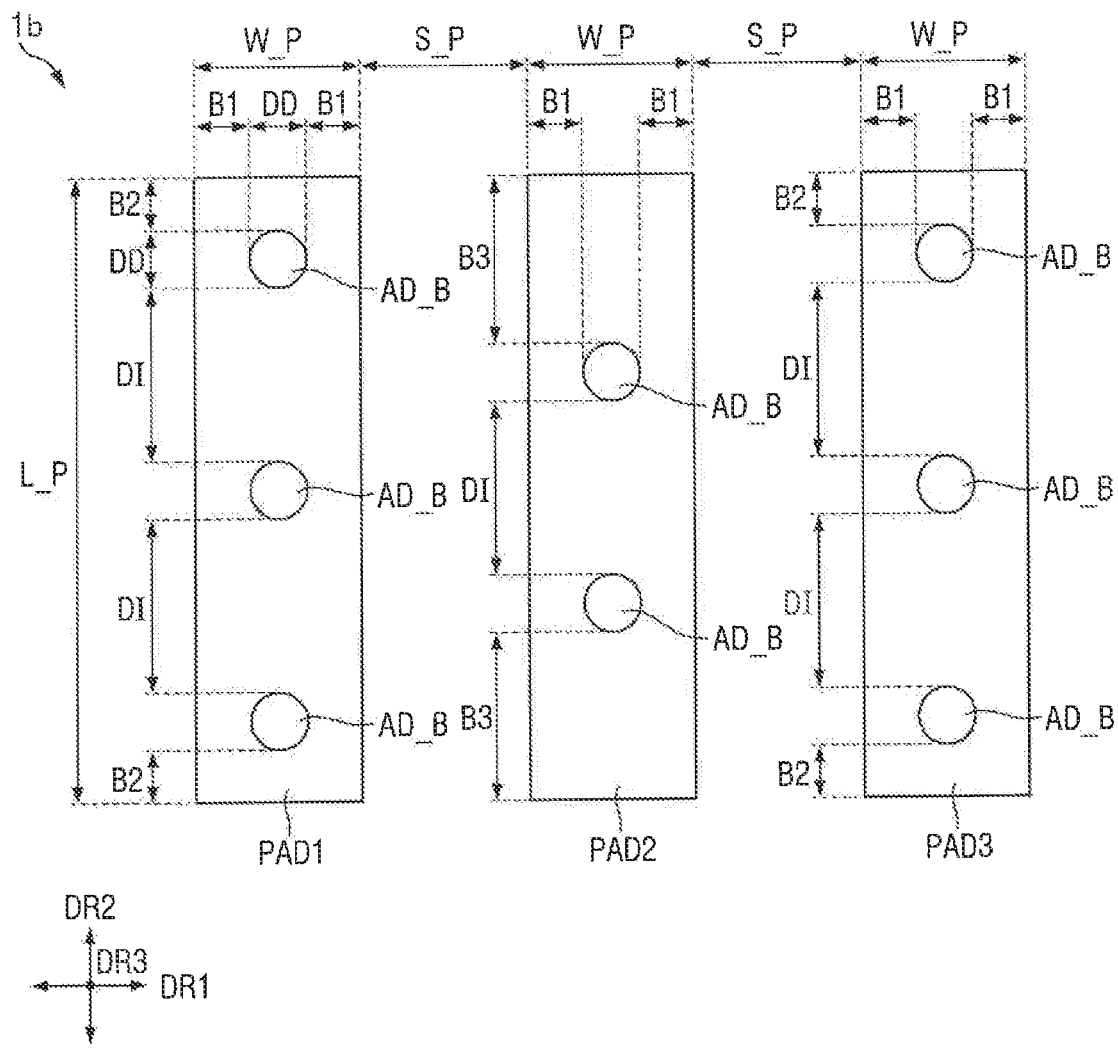
FIG. 6 is a plan view illustrating an arrangement of conductive particles according to an embodiment of the present invention.

FIG. 6 is a plan view illustrating an arrangement of conductive particles AD_B according to an embodiment of the present invention.

Referring to FIG. 6, unlike the embodiment of FIG. 4, a plurality of conductive particles AD_B may be disposed on a plurality of pad electrodes PAD to be staggered from each other in the first direction DR1. For example, a plurality of conductive particles AD_B of a first pad electrode PAD1 might not overlap a plurality of conductive particles AD_B of a second pad electrode PAD2 in the first direction DR1. Further, a plurality of conductive particles AD_B of a third pad electrode PAD3 may overlap the plurality of conductive particles AD_B of the first pad electrode PAD1, while not overlapping the plurality of conductive particles AD_B of the second pad electrode PAD2. In addition, the second pad electrode PAD2 may be disposed between the first pad electrode PAD1 and the third pad electrode PAD3. As an additional example, the plurality of conductive particles AD_B may be arranged to have an alternating arrangement along the first direction DR1. As a result, in the flow of the conductive particles AD_B, a short circuit caused by contact with other conductive particles AD_B flowing from the adjacent pad electrode PAD may be prevented. In this case, the number of the conductive particles AD_B disposed on the adjacent pad electrode PAD and the separation distance between the conductive particles AD_B and an edge of the pad electrode PAD may vary.

For convenience of description, in the following description, the pad electrode PAD disposed at a left side of FIG. 6, the pad electrode PAD disposed in a middle portion of FIG. 6, and the pad electrode PAD disposed at a right side of FIG. 6 are referred to as a first pad electrode PAD1, a second pad electrode PAD2, and a third pad electrode PAD3, respectively.

The conductive particles AD_B disposed on the first pad electrode PAD1 and the conductive particles AD_B disposed on the third pad electrode PAD3 may be arranged in the same manner. Thus, the conductive particles AD_B on the first pad electrode PAD1 may overlap the conductive particles AD_B on the third pad electrode PAD3 in the first direction DR1. In other words, the conductive particles AD_B on the first pad electrode PAD1 and the conductive particles AD_B on the third pad electrode PAD3 may be symmetrically disposed based on the second pad electrode PAD2. In addition, when viewed from the first direction DR1, the conductive particles AD_B disposed on the second pad electrode PAD2 may be disposed between the conductive particles AD_B on the first pad electrode PAD1 and the conductive particles AD_B on the third pad electrode PAD3. For example, the conductive particles AD_B disposed on the second pad electrode PAD2 may be disposed not to overlap the conductive particles AD_B on the first pad electrode PAD1 and the conductive particles AD_B on the third pad electrode PAD3 in the first direction DR1.

The conductive particles AD_B disposed on the first pad electrode PAD1 may be disposed to be spaced apart from edges of the first pad electrode PAD1 by a first separation distance B1 and a second separation distance B2, and the conductive particles AD_B disposed on the third pad electrode PAD3 may have substantially the same configuration as the conductive particles AD_B disposed on the first pad electrode PAD1. The first separation distance B1 and the second separation distance B2 are the same as those described above in FIG. 4.

The conductive particles AD_B disposed on the second pad electrode PAD2 may be disposed to be spaced apart from an edge of the second pad electrode PAD2 by a third separation distance B3 that is greater than the second separation distance B2. The third separation distance B3 may be a distance measured from a short side of the second pad electrode PAD2 in the second direction DR2. In an example, the third separation distance B3 may be about two or more times the second separation distance B2. In another example, the third separation distance B3 may be greater than the second separation distance B2 and less than or equal to the first pitch.

The conductive particles AD_B disposed on the second pad electrode PAD2 may be disposed to be spaced apart from the edge of the second pad electrode PAD2 by the first separation distance B1. For example, the conductive particles AD_B disposed on the second pad electrode PAD2 and the conductive particles AD_B disposed on the first pad electrode PAD1 may have the same separation distance from the edge of each pad electrode PAD in the first direction DR1.

Figure 7:
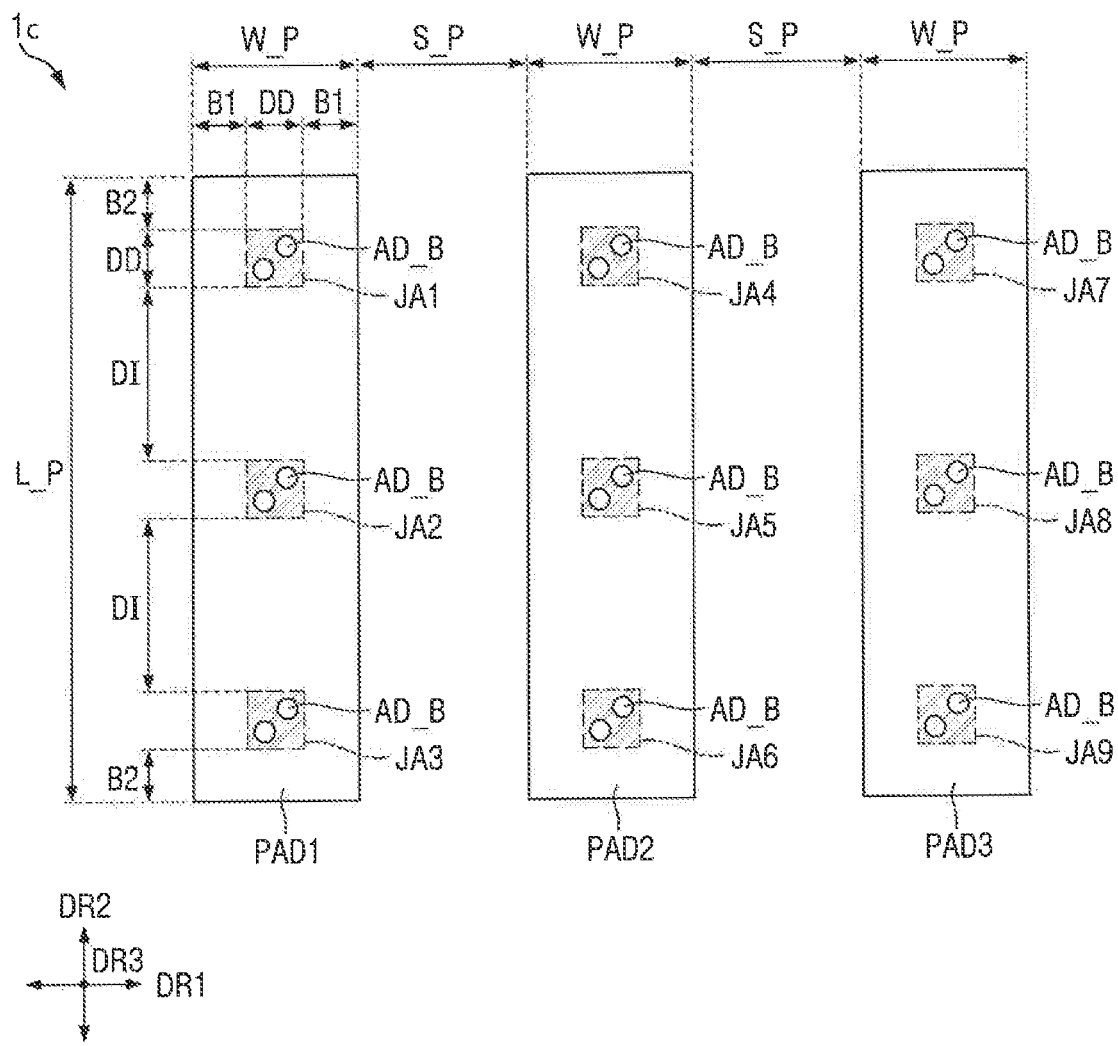
FIG. 7 is a plan view illustrating an arrangement of conductive particles according to an embodiment.

An embodiment of FIG. 7 is substantially the same as or similar to the embodiment of FIG. 4 except for the arrangement of the plurality of conductive particles AD_B, and thus in the following, redundant descriptions may be omitted.

FIG. 7 is a plan layout view of conductive particles AD_B according to embodiment of the present invention.

Referring to FIG. 7, a plurality of jetting areas JA may be provided in a plurality of pad electrodes PAD in a plan view. Referring to FIG. 3, the plurality of jetting areas JA may be arranged in a manner substantially the same as or similar to the manner in which the plurality of conductive particles AD_B of FIG. 3 are individually disposed.

The plurality of jetting areas JA may be arranged in a matrix form on the plurality of pad electrodes PAD. In this case, the plurality of jetting areas JA may be arranged to form one row extending in the second direction DR2 on each pad electrode PAD. Since the plurality of pad electrodes PAD are arranged at a first pitch in the first direction DR1, the rows disposed on each pad electrode PAD may be arranged to have the first pitch in the first direction DR1.

The plurality of conductive particles AD_B may be located only in the plurality of jetting areas JA. In FIG. 7, two conductive particles AD_B are disposed in one jetting area JA, but the number of the conductive particles AD_B is not limited thereto.

The first pad electrode PAD1 may include a first jetting area JA1, a second jetting area JA2, and a third jetting area JA3. The second pad electrode PAD2 may include a fourth jetting area JA4, a fifth jetting area JA5, and a sixth jetting area JA6. The third pad electrode PAD3 may include a seventh jetting area JA7, an eighth jetting area JA8, and a ninth jetting area JA9. However, the number of the jetting areas JA is not limited to the above example.

The first jetting area JA1, the fourth jetting area JA4, and the seventh jetting area JA7 may be disposed to overlap in the first direction DR1. In addition, the second jetting area JA2, the fifth jetting area JA5, and the eighth jetting area JA8 may be disposed to overlap in the first direction DR1, and the third jetting area JA3, the sixth jetting area JA6, and the ninth jetting area JA9 may also be disposed to overlap in the first direction DR1.

Since the plurality of jetting areas JA on the second pad electrode PAD2 and the third pad electrode PAD3 are arranged in a manner substantially the same as or similar to the plurality of jetting areas JA on the first pad electrode PAD1, the plurality of jetting areas JA on the first pad electrode PAD1 will be mainly described in the following.

As described above, the first jetting area JA1, the second jetting area JA2, and the third jetting area JA3 may be disposed on the first pad electrode PAD1 to form a row extending in the second direction DR2. In this case, the first jetting area JA1, the second jetting area JA2, and the third jetting area JA3 may be disposed to be spaced apart from each other by a second pitch. The second pitch may be less than or equal to the first pitch.

The first jetting area JA1, the second jetting area JA2, and the third jetting area JA3 may be disposed to be spaced apart from long sides of the first pad electrode PAD1, which extend in the first direction DR1, by a first separation distance B1. The first jetting area JA1 and the third jetting area JA3 may be jetting areas JA closest to the short sides. For example, the first jetting area JA1 may be closest to a first short side of the first pad electrode PAD1, and the third jetting area JA3 may be closest to a second short side, opposite to the first short side, of the first pad electrode PAD1.

The first jetting area JA1 and the third jetting area JA3 may be disposed to be spaced apart from their respective short side of the first pad electrode PAD1, which extends in the second direction DR2, by a second separation distance B2.

The plurality of conductive particles AD_B may be dispersed in each of the plurality of pad electrodes PAD, but may be restrictively disposed in a specific area within one pad electrode PAD, so that it is possible to prevent a short circuit caused by a flow of the conductive particles AD_B.

The embodiment of FIG. 7 is substantially the same as or similar to the embodiment of FIG. 4 except that the plurality of jetting areas JA, and thus in the above, redundant descriptions may have been omitted.

Figure 8:
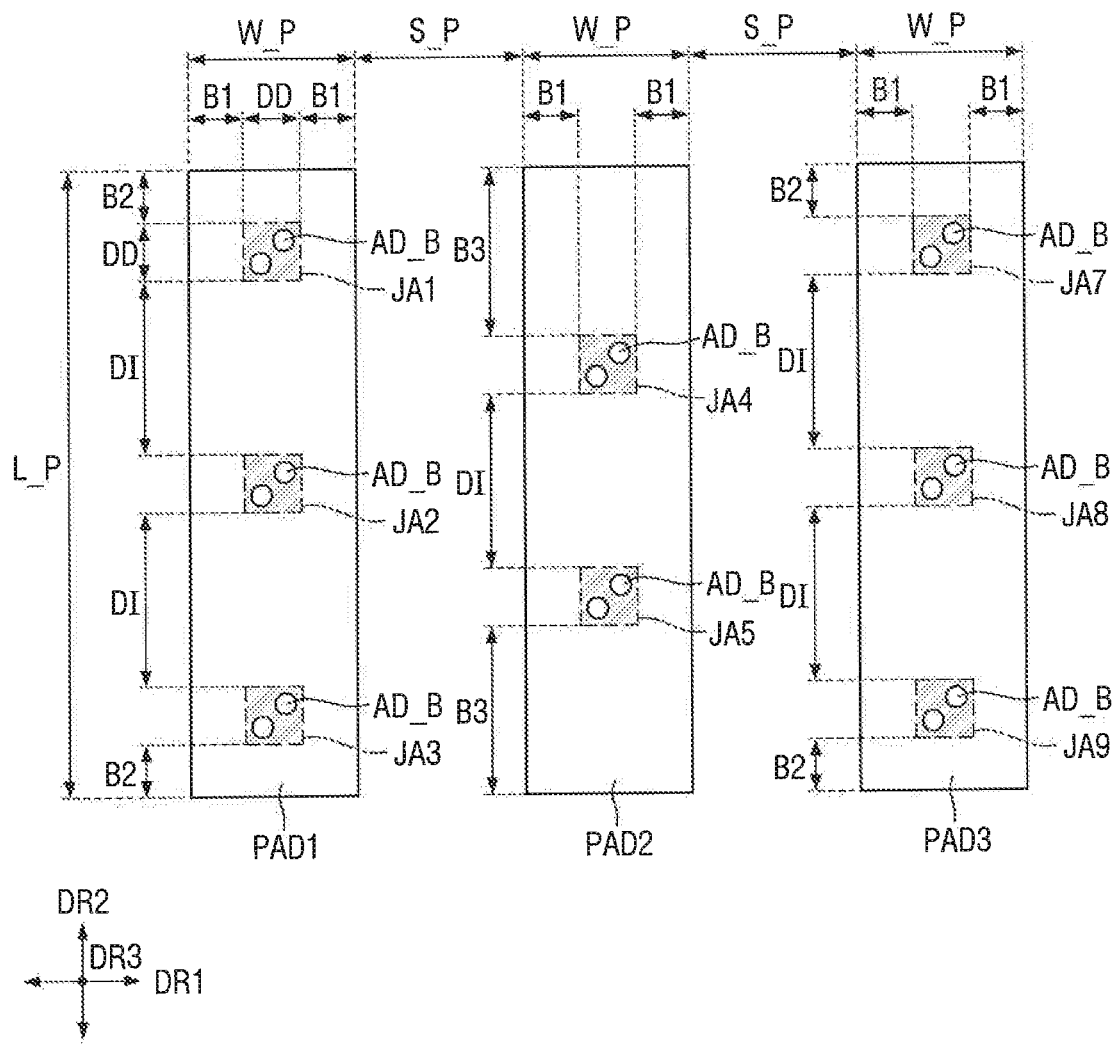
FIG. 8 is a plan view illustrating an arrangement of conductive particles according to an embodiment of the present invention.

FIG. 8 is a plan layout view of conductive particles AD_B according to yet another exemplary embodiment.

Referring to FIG. 8, unlike the embodiment of FIG. 7, a plurality of jetting areas JA may be disposed on a plurality of pad electrodes PAD to be staggered from each other in the first direction DR1. In the embodiment of FIG. 8, the plurality of jetting areas JA may be arranged in a manner substantially the same as or similar to the manner in which the plurality of conductive particles AD_B of FIG. 6 are individually disposed. In this case, the number of the jetting areas JA and/or the number of the conductive particles AD_B disposed on each of the adjacent pad electrodes PAD may be different from each other.

A first jetting area JA1, a second jetting area JA2, and a third jetting area JA3 may disposed on a first pad electrode PAD1, and a seventh jetting area JA7, an eighth jetting area JA8, and a ninth jetting area JA9 may be disposed on a third pad electrode PAD3. Only a fourth jetting area JA4 and a fifth jetting area JA5 may be disposed on a second pad electrode PAD2. However, the number of the jetting areas JA is not limited to the above example.

The fourth jetting area JA4 and the fifth jetting area JA5 may be disposed to be spaced apart from short sides of the second pad electrode PAD2, which extend in the first direction DR1, by a third separation distance B3. The third separation distance B3 may be greater than a first separation distance B1 and/or a second separation distance B2.

Accordingly, the jetting areas JA disposed on the second pad electrode PAD2 may be disposed to not overlap the jetting areas JA disposed on the first pad electrode PAD1 or the jetting areas JA disposed on the third pad electrode PAD3 in the first direction DR1.

The embodiment of FIG. 8 is substantially the same as or similar to the embodiment of FIG. 7 except for the arrangement of the jetting areas JA, and thus in the above, redundant descriptions may have been omitted.

Figure 9:
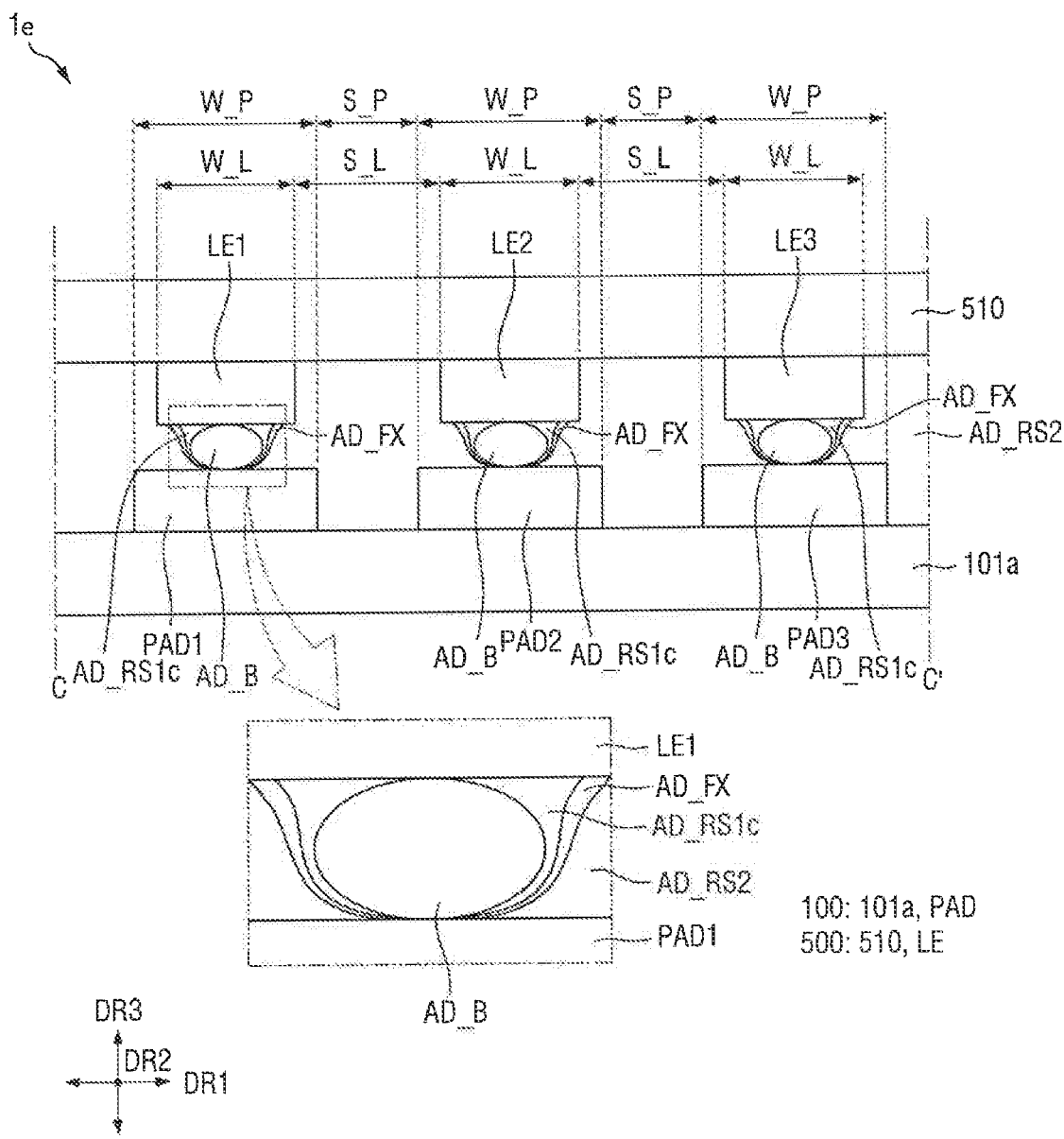
FIG. 9 is a cross-sectional view of a display device according to an embodiment of the present invention.

FIG. 9 is a cross-sectional view of a display device 1e according to an embodiment of the present invention.

Referring to FIG. 9, as described above, a plurality of conductive particles AD_B may be coated with a coating layer AD_RS1c. However, unlike the embodiment of FIG. 3, the coating layer AD_RS1c may include a metal.

The coating layer AD_RS1c may include at least one of lead and/or tin. For example, the coating layer AD_RS1c may be made of an Sn—Pb-based alloy. In this case, a composition ratio of the tin may be about 61.9%. The coating layer AD_RS1c might not include the lead. For example, the coating layer AD_RS1c may include at least one among an Sn—Ag based alloy, an Sn—Cu based alloy, an Sn—Ag—Cu based alloy, an Sn—Ag—Cu—Bi based alloy, an Sn—Zn based alloy, an Sn—Zn—Al based alloy, an Sn—Zn—Bi based alloy, an Sn—Bi based alloy, an Sn—Ag—Zn based alloy, an Sn—In based alloy, and/or an Sn—Ag—Bi—In based alloy. In addition, the coating layer AD_RS1c may include at least one among rosins, rheological additives, solvents, and/or activators.

However, the coating layer AD_RS1c is not limited thereto and may include a thermosetting resin similar to that in the embodiment of FIG. 3.

Unlike the embodiment of FIG. 3, a thickness of the coating layer AD_RS1c in the first direction DR1 may increase from a pad electrode PAD toward a lead electrode LE. The thickness may be a length of the coating layer AD_RS1c in the first direction DR1 measured based on a surface of the conductive particle AD_B. At a point of an upper end of the conductive particle AD_B in contact with the lead electrode LE and a point of a lower end of the conductive particle AD_B in contact with the pad electrode PAD, the coating layer AD_RS1c may not be disposed, and the conductive particle AD_B may be in direct contact with the lead electrode LE and the pad electrode PAD. A total width of the coating layer AD_RS1c in the first direction DR1 may increase from the pad electrode PAD toward the lead electrode LE. As will be described below, a change in thickness of the coating layer AD_RS1c may be a trace (result) formed by a process of jetting and fixing (e.g., curing) the conductive particles AD_B to a printed circuit board 500 first, and pressing the printed circuit board 500 and a first substrate 101a.

However, the change in thickness of the coating layer AD_RS1c is not limited to the above example, and the thickness of the coating layer AD_RS1c may also increase from the lead electrode LE toward the pad electrode PAD, as shown in FIG. 3. In this case, a thickness of a flux layer AD_FX, which will be described below, may also increase from the lead electrode LE toward the pad electrode PAD.

The display device 1e may further include the flux layer AD_FX covering at least a portion of the coating layer AD_RS1c. The flux layer AD_FX may be interposed between the coating layer AD_RS1c and a filling member AD_RS2. Similar to the coating layer AD_RS1c, a thickness of the flux layer AD_FX may increase from the pad electrode PAD toward the lead electrode LE. The thickness may be a length of the flux layer AD_FX in the first direction DR1 measured based on a surface of the coating layer AD_RS1c. The thickness of the flux layer AD_FX may be less than the thickness of the coating layer AD_RS1c.

The flux layer AD_FX may include at least one among rosins, rheological additives, solvents, and/or activators.

Figure 10:
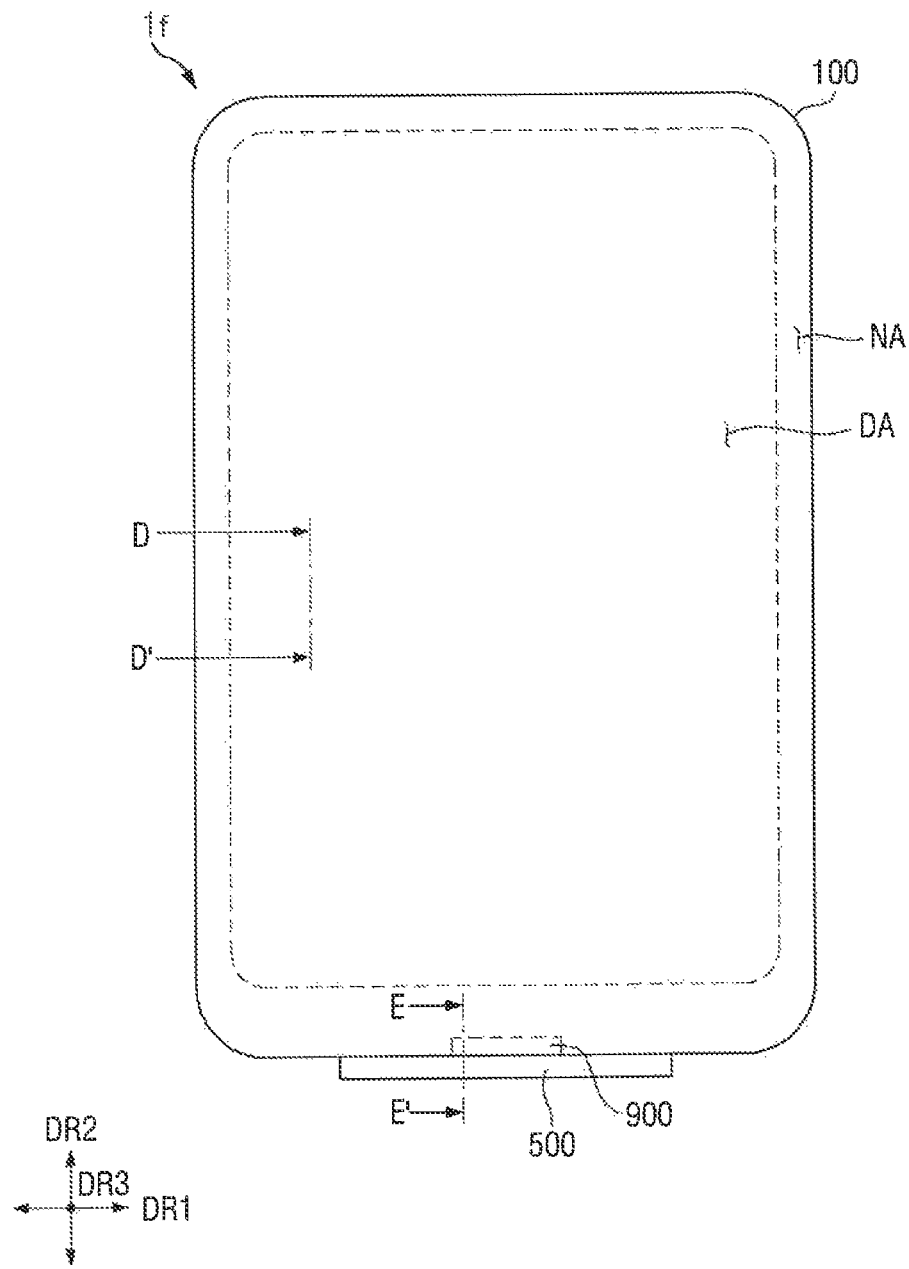
FIG. 10 is a plan view of a display device according to an embodiment of the present invention.
Figure 11:
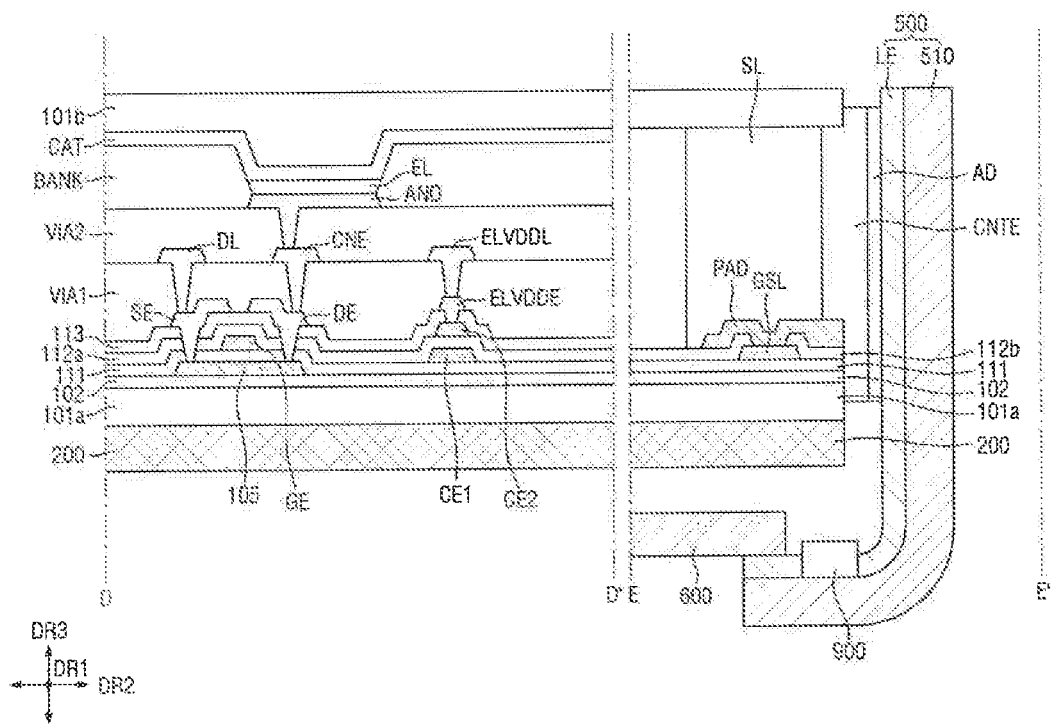
FIG. 11 is a set of cross-sectional views taken along line D-D' and line E-E' of FIG. 10.

FIG. 10 is a plan view of a display device according to an embodiment of the present invention. FIG. 11 is a set of cross-sectional views taken along line D-D' and line E-E' of FIG. 10.

Referring to FIGS. 10 and 11, unlike the embodiment of FIGS. 1 and 2, a printed circuit board 500 may be attached to a side surface of a display panel 100. In other words, the printed circuit board 500 may be side-bonded to the display panel 100.

The display panel 100 may include a second substrate 101b facing a first substrate 101a, and a sealing member SL disposed between the first substrate 101a and the second substrate 101b to seal a space between the first substrate 101a and the second substrate 101b. In this case, the thin-film encapsulation layer 170 may be omitted.

A connection pad CNTE may be disposed on one end of the first substrate 101a and one end of the second substrate 101b, which are disposed in a non-display area NA. For example, the connection pad CNTE may be disposed on the sealing member SL between the first substrate 101a and the second substrate 101b. A portion of the connection pad CNTE may be formed to protrude toward the space between the first substrate 101a and the second substrate 101b. The connection pad CNTE may electrically connect an adhesive member AD to a pad electrode PAD on the first substrate 101a. The pad electrode PAD may be disposed on second insulating layers 112a and 112b such that at least a portion thereof is exposed in a direction of a side surface of the first substrate 101a. For example, the exposed portion of the pad electrode PAD may be adjacent to a side surface of the first substrate 101a.

The adhesive member AD may be interposed between the connection pad CNTE and a lead electrode LE. The adhesive member AD may attach the printed circuit board 500 to the display panel 100, and may electrically connect the connection pad CNTE and the lead electrode LE to each other.

In a cross-sectional view, abase film 510 and/or the lead electrode LE of the printed circuit board 500 may extend in the thickness direction on a side surface of the display panel 100, but may be bent around the display panel 100 to overlap a lower surface of the display panel 100 in the thickness direction. For example, the printed circuit board 500 may overlap a side surface of the display panel 100 and may bend around the display panel 100 to overlap the lower surface of the display panel 100. For example, the base film 510 and the lead electrode LE may have an "L" shape.

The embodiment of FIGS. 10 and 11 is substantially the same as or similar to the embodiment of FIGS. 1 and 2 except for the attachment method of the printed circuit board 500, and thus in the above description, redundant descriptions may have been omitted.

Figure 12:
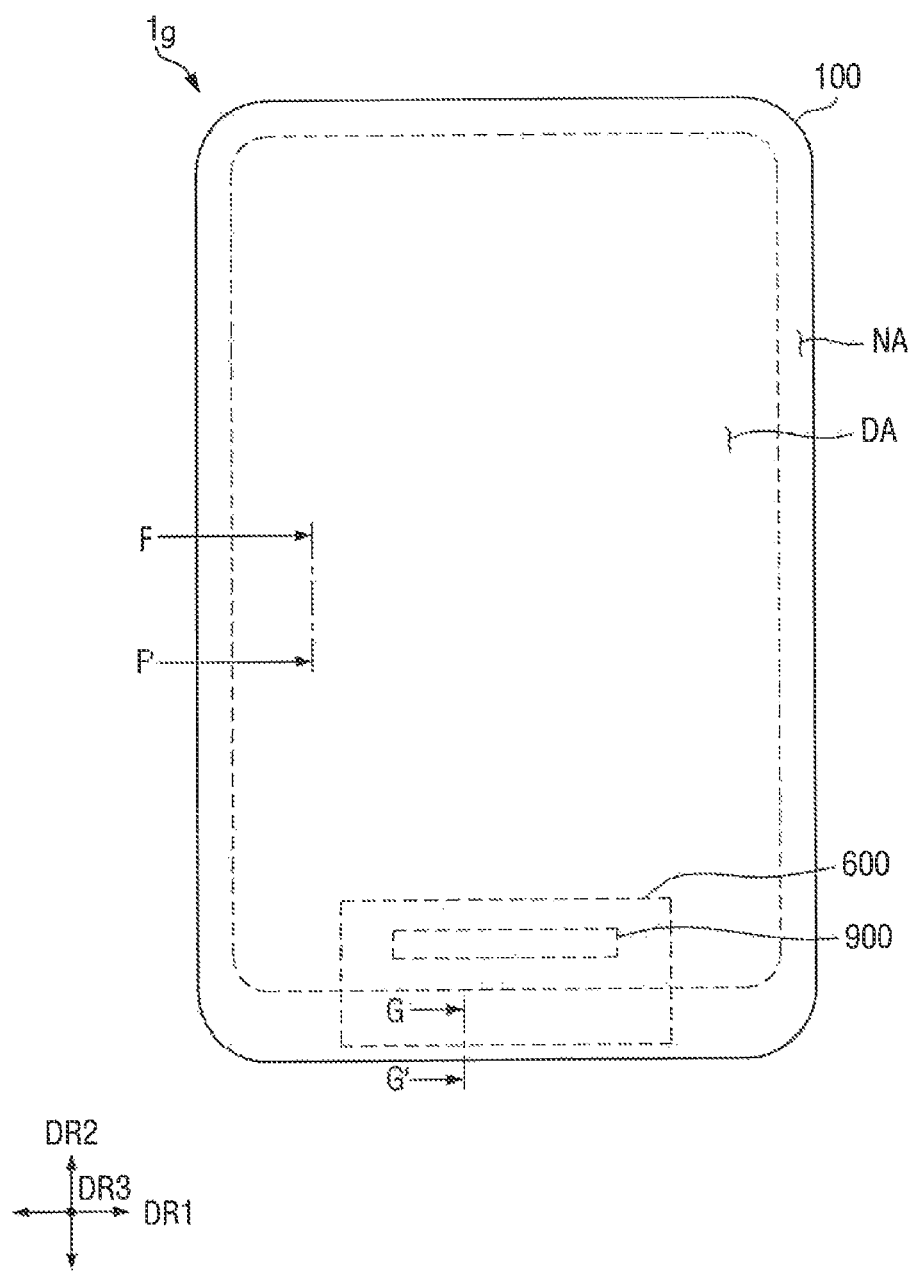
FIG. 12 is a plan view of a display device according to an embodiment of the present invention.
Figure 13:
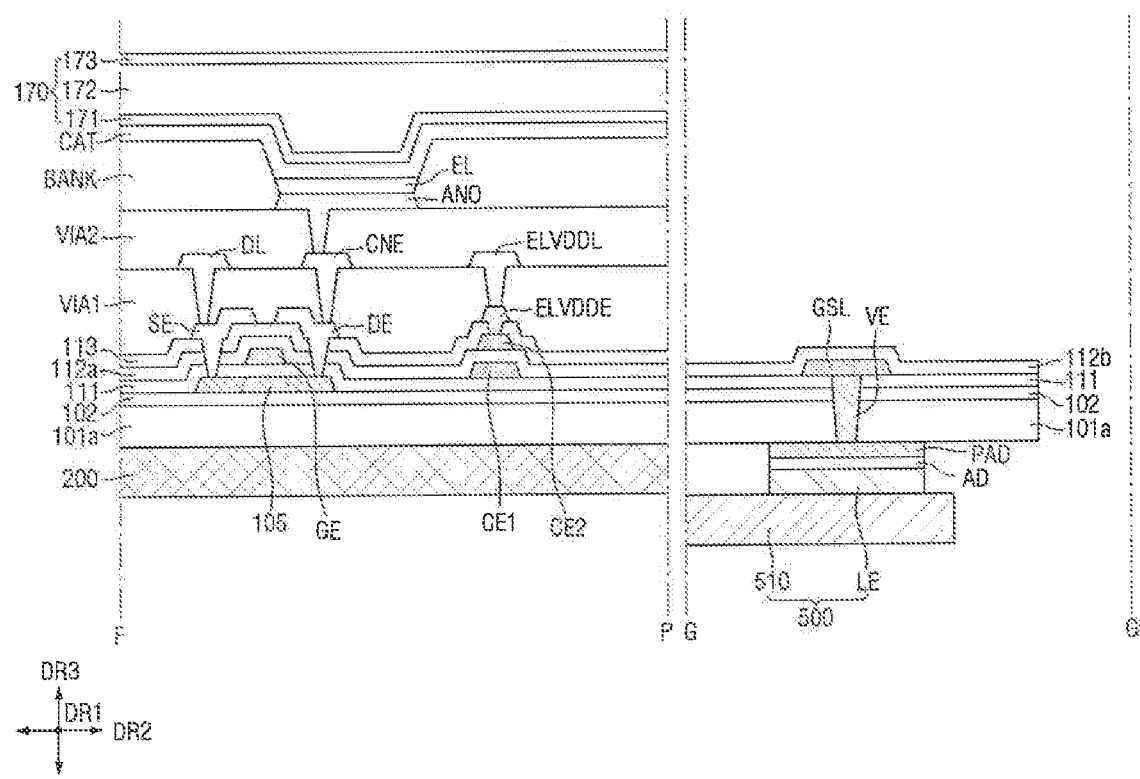
FIG. 13 is a set of cross-sectional views taken along line F-F' and line G-G' of FIG. 12.

FIG. 12 is a plan view of a display device 1g according to an embodiment of the present invention. FIG. 13 is a set of cross-sectional views taken along line F-F' and line G-G' of FIG. 12.

Referring to FIGS. 12 and 13, unlike the embodiment of FIGS. 1 and 2, a printed circuit board 500 may be attached to aback surface of a display panel 100. For example, the printed circuit board 500 may be attached to the display panel 100 in a back bonding manner.

The display device 1g may further include a via electrode VE passing through a first substrate 101a and layers between the first substrate 101a and a signal line GSL. The layers between the signal line GSL and the first substrate 101a may be a buffer layer 102 and a gate insulating layer 111, but the present disclosure is not limited thereto.

One side of the via electrode VE may be connected to the signal line GSL, and the other side thereof may be connected to a pad electrode PAD. The via electrode VE may electrically connect the signal line GSL and the pad electrode PAD to each other. Unlike the embodiment of FIG. 2, the pad electrode PAD may be formed on a back surface of the first substrate 101a, and the signal line GSL may be completely covered by second insulating layers 112a and 112b.

A lead electrode LE and abase film 510 of the printed circuit board 500 may be disposed on the back surface of the first substrate 101a to overlap the first substrate 101a in the thickness direction. An adhesive member AD may be interposed between the back surface of the first substrate 101a and the lead electrode LE to bond and electrically connect the pad electrode PAD and the lead electrode LE to each other.

The embodiment of FIGS. 12 and 13 is substantially the same as or similar to the embodiment of FIGS. 1 and 2 except for the attachment position of the printed circuit board 500, and thus in the above description, redundant descriptions may be omitted.

Figure 14:
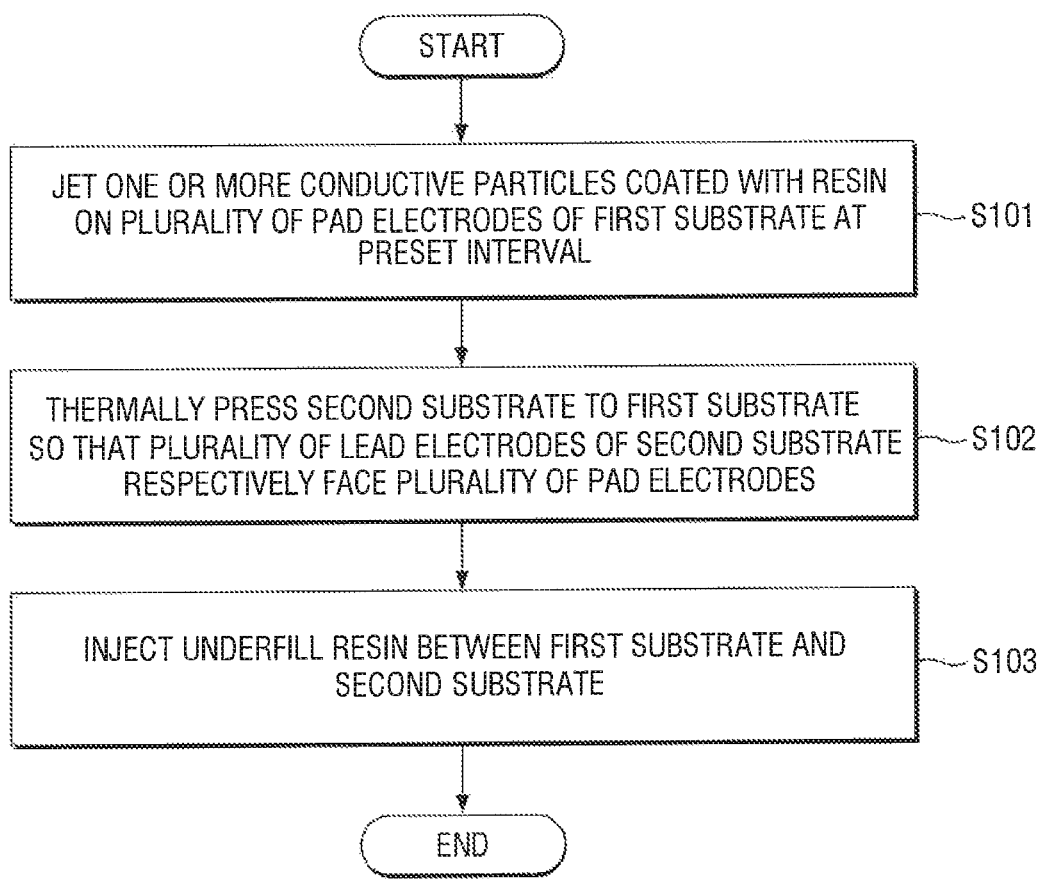
FIG. 14 is a flowchart illustrating a method of manufacturing a display device according to an embodiment of the present invention.
Figure 15:
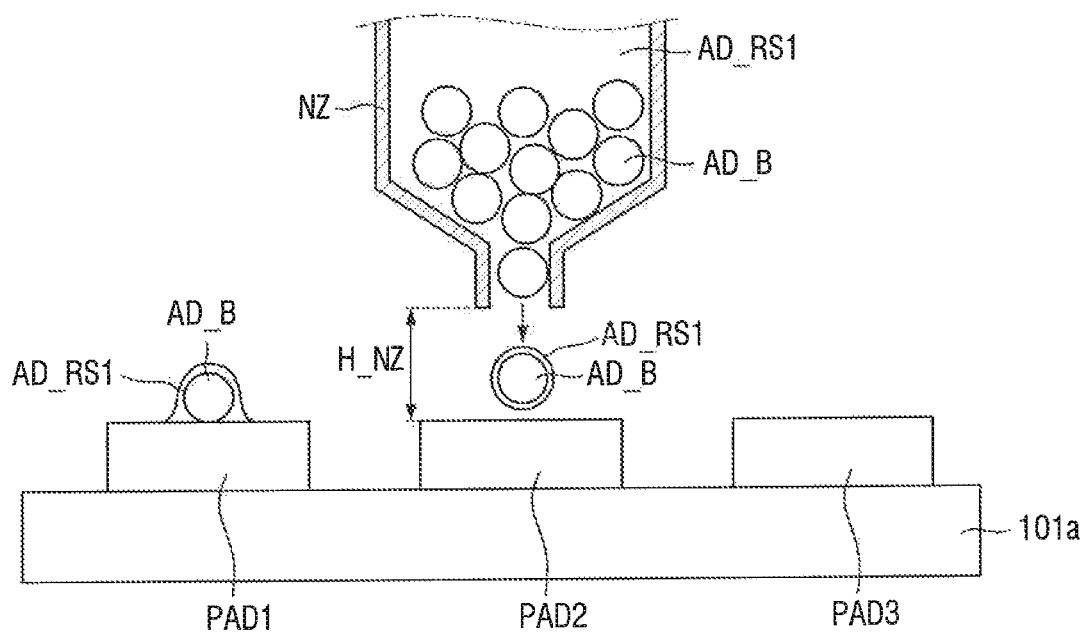
FIGS. 15, 16 and 17 are diagrams illustrating operations of the method of manufacturing a display device according to an embodiment of the present invention.
Figure 16:
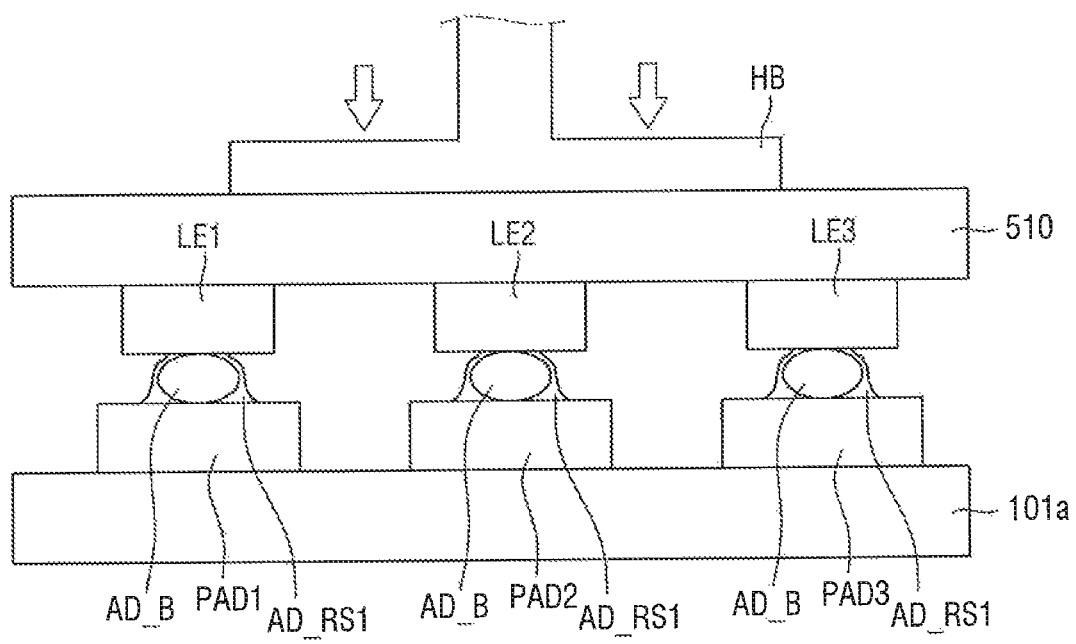
Figure 17:
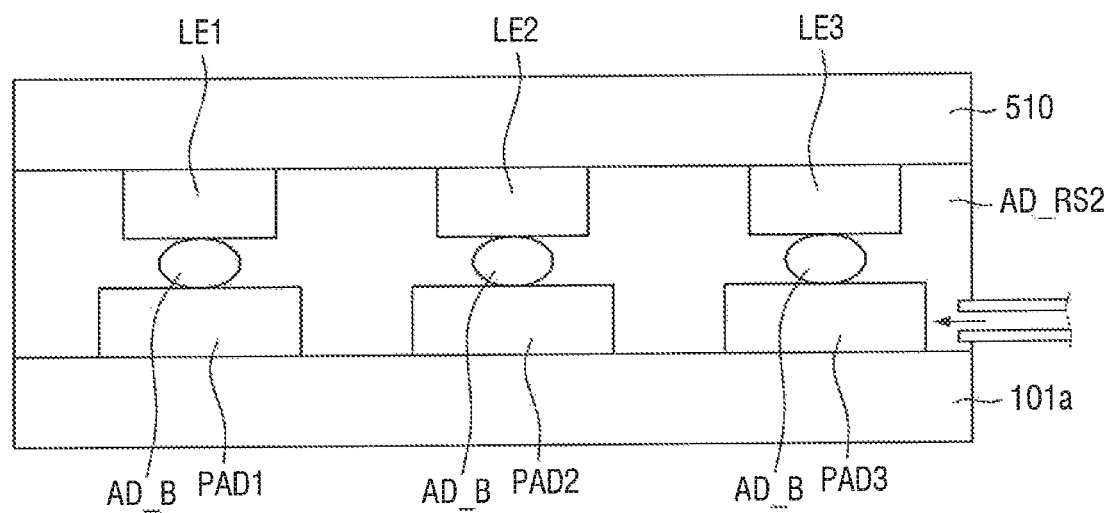

FIG. 14 is a flowchart illustrating a method of manufacturing a display device according to an embodiment of the present invention. FIGS. 15 to 17 are diagrams illustrating operations of the method of manufacturing a display device according to an embodiment of the present invention.

A display device 1 manufactured by the method of manufacturing a display device may be the display device 1, 1a, 1b, 1c, 1d, 1e, 1f or 1g of FIGS. 1 to 13, but the present invention is not limited thereto.

Referring to FIG. 14, the method of manufacturing a display device may include jetting a plurality of conductive particles AD_B and a coating layer AD_RS1, which is coated on the plurality of conductive particles AD_B, on a plurality of pad electrodes PAD of a first substrate 101a (S101). The method further includes thermally pressing a printed circuit board 500 to the first substrate 101a so that a plurality of lead electrodes LE of the printed circuit board 500 face the plurality of pad electrodes PAD, respectively (S102), and injecting an underfill resin into a space between the first substrate 101a and the printed circuit board 500 (S103).

The method of manufacturing a display device is not limited to the above example, and in the following description with reference to FIGS. 15 to 21, at least some of the operations may be omitted, or one or more other operations may be added.

Referring to FIG. 15, the first substrate 101a may be prepared. The first substrate 101a may be in a state in which the plurality of pad electrodes PAD are formed on one surface thereof. With further reference to FIGS. 3 and 4, the plurality of pad electrodes PAD may be disposed to be spaced apart from each other by a first pitch in a first direction DR1, and may each extend in a second direction DR2.

One or more conductive particles AD_B may be jetted on the plurality of pad electrodes PAD. The conductive particles AD_B may be in a state of being coated with the coating layer AD_RS1. The coating layer AD_RS1 may have a viscosity of about 500 cps to about 1000 cps at 25° C. For example, the viscosity of the coating layer AD_RS1 may be about 600 cps. The coating layer AD_RS1 may be a thermosetting acrylic resin. With further reference to FIG. 3, when the conductive particles AD_B are seated on the pad electrode PAD, the coating layer AD_RS1 may flow due to gravity and have a thickness (or width) in a horizontal direction, which increases toward the pad electrode PAD.

The conductive particles AD_B may be jetted on the plurality of pad electrodes PAD at predetermined intervals through a jetting nozzle NZ of a jetting device. A temperature of the jetting nozzle NZ may be maintained at about 30° C. to about 40° C. to prevent curing of the resin. The jetting nozzle NZ may have a diameter greater than a diameter DD of the conductive particle AD_B, and may have a diameter less than about twice the diameter DD of the conductive particle AD_B. The conductive particles AD_B may be adjusted so that only one conductive particle AD_B is jetted when discharged from the jetting nozzle NZ. The conductive particles AD_B may be discharged at a first height H_NZ from the pad electrode PAD. In an example, the first height H_NZ may be about 100 times to about 300 times the diameter DD of the conductive particle AD_B. In another example, the first height H_NZ may be in a range of about 0.5 mm to about 1.0 mm. Since the conductive particles AD_B are discharged to the pad electrode PAD from an appropriate distance, aggregation between the conductive particles AD_B, which may occur when the conductive particles AD_B are discharged at a position near the pad electrode PAD, may be prevented, and jetting tolerance, which may occur when the conductive particles AD_B are discharged at a position far away from the pad electrode PAD, may be minimized.

For example, the above-described jetting process may be performed in a chamber. The environment in the chamber may be adjusted to have appropriate oxygen and moisture permeability for the jetting process. For example, the oxygen and moisture permeability may be about 33 g/m³/24 h.

The jetting device may jet the plurality of conductive particles AD_B on the plurality of pad electrodes PAD to have the arrangement illustrated in FIG. 4, 6, 7, or 8. As shown in FIGS. 4 and 6, the plurality of conductive particles AD_B may be jetted to form one row on one pad electrode PAD. In addition, as shown in FIGS. 7 and 8, the plurality of conductive particles AD_B may be jetted into a plurality of jetting areas JA. The detailed arrangement relationship between the plurality of pad electrodes PAD and the plurality of conductive particles AD_B is the same as that described above in FIGS. 4, 6, 7, and 8, and thus in the following, redundant descriptions will be omitted.

Referring to FIG. 16, after the jetting operation is completed, a base film 510 of the printed circuit board 500 may be disposed to overlap the first substrate 101a. In this case, the plurality of lead electrodes LE on the base film 510 of the printed circuit board 500 and the plurality of pad electrodes PAD of the first substrate 101a may be disposed to face each other.

After the alignment of the first substrate 101a and the base film 510 is completed, the base film 510 may be thermally pressed to the first substrate 101a by a pressing member HB.

The pressing member may, for example, press the base film 510 at about 3 MPa to about 6 MPa. In this case, the pressing member may be heated to a predetermined temperature to thermally cure the coating layer AD_RS1. The predetermined temperature may be, for example, in a range of about 140° C. to about 200° C. The pressing member HB may press the base film 510 only for a predetermined time. The predetermined time may be a time sufficient to thermally cure the coating layer AD_RS1. The predetermined time may be, for example, in a range of about 4 seconds to about 6 seconds.

Referring to FIG. 17, after the thermally pressing of the base film 510 is completed, a filling member AD_RS2 may be filled into a space between the first substrate 101a and the base film 510. The filling member AD_RS2 may be an underfill resin. As described above, the filling member AD_RS2 and the coating layer AD_RS1 may have the same type of resin or different types of resin. The filling member AD_RS2 may be a thermosetting resin, or may be an ultraviolet curable resin. After the filling member AD_RS2 is cured, bonding between the display panel 100 and the printed circuit board 500 may be completed.

FIGS. 18 to 21 are diagrams illustrating operations of a method of manufacturing a display device according to an embodiment of the present invention.

Figure 18:
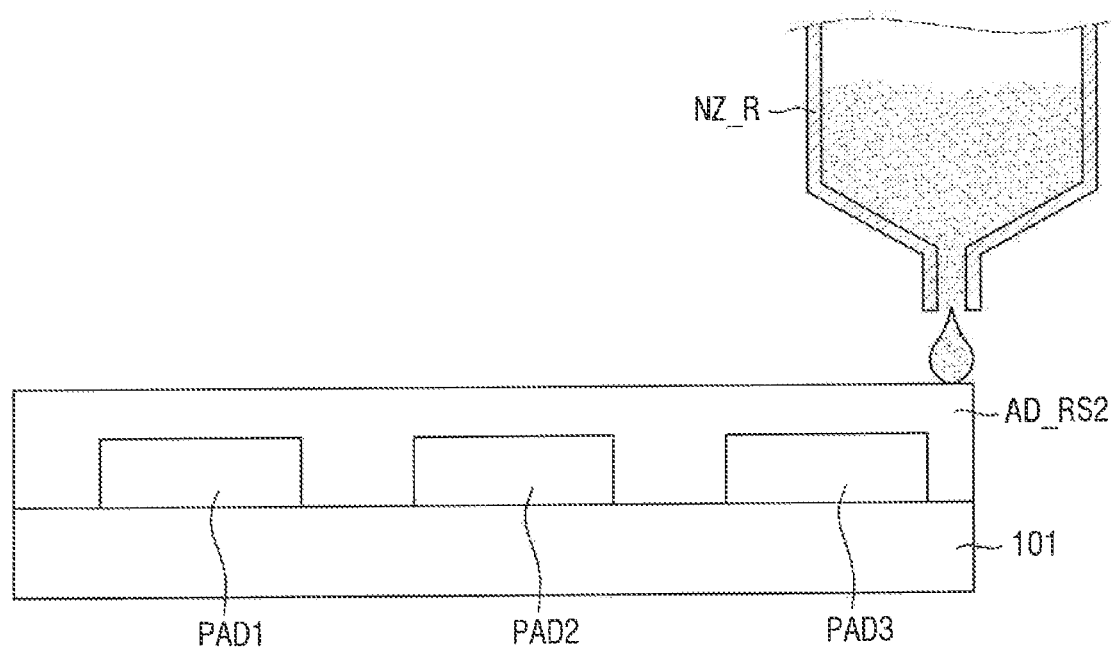
FIGS. 18, 19, 20 and 21 are diagrams illustrating operations of a method of manufacturing a display device according to an embodiment of the present invention.

Referring to FIG. 18, first a filling member AD_RS2 may be applied onto one surface of a first substrate 101a on which a plurality of pad electrodes PAD are formed by, for example, a nozzle NZ_R. The filling member AD_RS2 may be a thermosetting resin. The resin may be filled into a space between the plurality of pad electrodes PAD and may be applied to have a thickness greater than a thickness of each of the plurality of pad electrodes PAD to cover the plurality of pad electrodes PAD. For example, the filling member AD_RS2 may completely cover the plurality of pad electrodes PAD.

Figure 19:
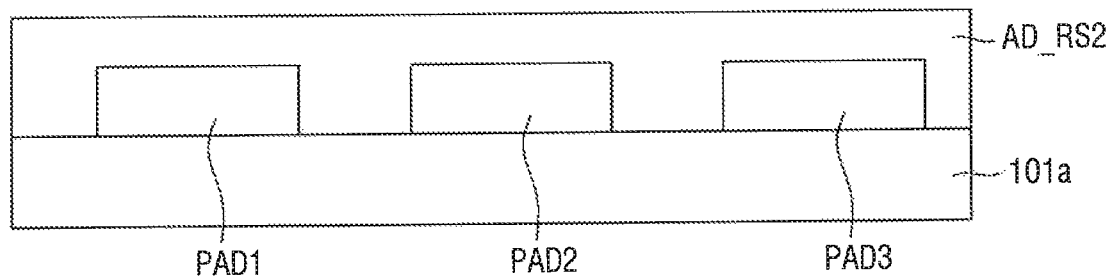

Referring to FIG. 19, after the filling member AD_RS2 is applied, a portion of the filling member AD_RS2 located above the plurality of pad electrodes PAD may be removed. However, even in this case, the filling member AD_RS2 may have a thickness that is greater than each of the plurality of pad electrodes PAD so that the plurality of pad electrodes PAD may be completely covered to not be exposed to the outside through the filling member AD_RS2.

Figure 20:
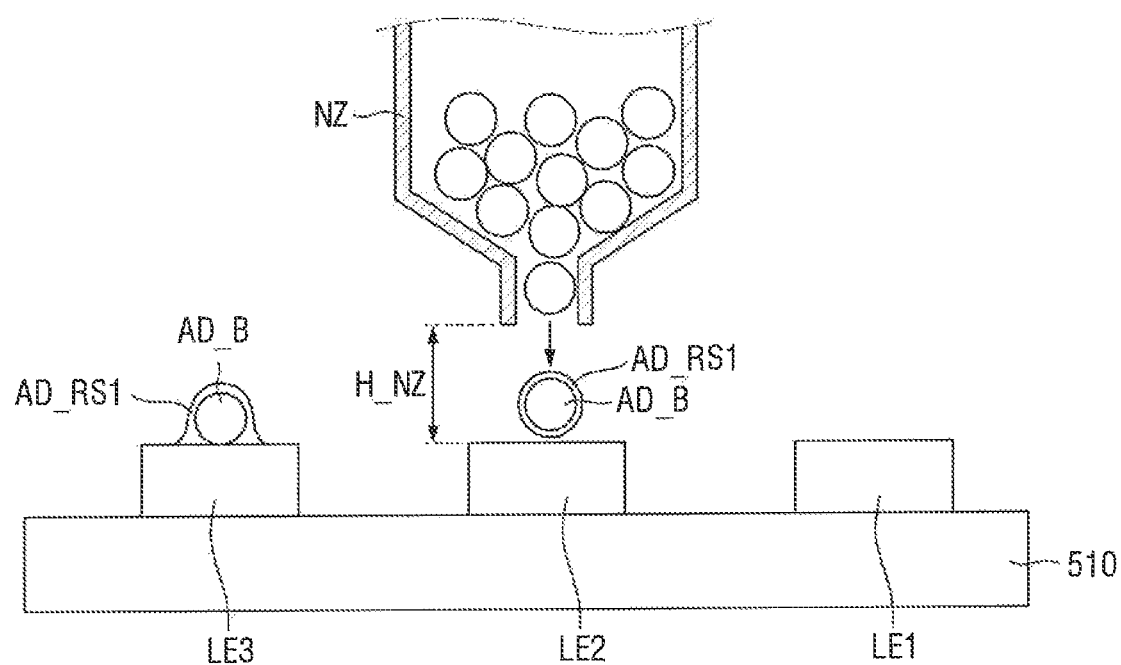

Referring to FIG. 20, a plurality of conductive particles AD_B may be jetted on a plurality of lead electrodes LE disposed on the base fil 510 of the printed circuit board 500. In this case, as shown in FIG. 20, the base film 510 may be in a vertically inverted state.

With further reference to FIGS. 4, 6, 7, 8, and 14, the plurality of conductive particles AD_B may be jetted in a manner substantially the same as or similar to the manner in which the conductive particles AD_B are jetted on the plurality of pad electrodes PAD. For example, in a plan view, the plurality of lead electrodes LE may be formed of a plurality of rectangular members spaced apart from each other by a first pitch in a first direction DR1 and may each extend in a second direction DR2, similar to the plurality of pad electrodes PAD. In this case, similar to the case of FIGS. 4 and 6, the plurality of conductive particles AD_B may be jetted to form one row on each lead electrode LE and to be spaced apart from an edge of the lead electrode LE by a first separation distance B1 and a second separation distance B2. In addition, the plurality of conductive particles AD_B may be sprayed only within a plurality of jetting areas JA provided on the plurality of lead electrodes LE, similar to the case of FIGS. 7 and 8.

The conductive particles AD_B may be jetted on the lead electrodes LE in a state of being coated with a coating layer AD_RS1. As described above, the coating layer AD_RS1 may include a metal. For example, the metal may include at least one of tin and/or lead.

The coating layer AD_RS1 may be jetted while being heated in a jetting nozzle NZ. The coating layer AD_RS1 may be cured by the ambient temperature after being seated on the lead electrode LE. With further reference to FIG. 9, when the conductive particles AD_B are seated on the lead electrode LE, the coating layer AD_RS1 may flow due to gravity and have a thickness (or width) in a horizontal direction, which increases toward the lead electrode LE. The flux layer as shown in FIG. 9 may be formed on the coating layer AD_RS1. The flux layer AD_FX may also increase in thickness in the horizontal direction toward the lead electrode LE.

However, the shape of each of the coating layer AD_RS1 and the flux layer AD_FX is not limited thereto, and for example, the coating layer AD_RS1 may not be jetted in a heated state and may be melted and flowed by a thermal pressing process to be described below, and the coating layer AD_RS1 and the flux layer AD_FX may increase in thickness in the horizontal direction toward the pad electrode PAD.

The jetting process of the conductive particles AD_B may be performed before, after, or simultaneously with a process of applying the filling member AD_RS2 to the first substrate 101a.

Figure 21:
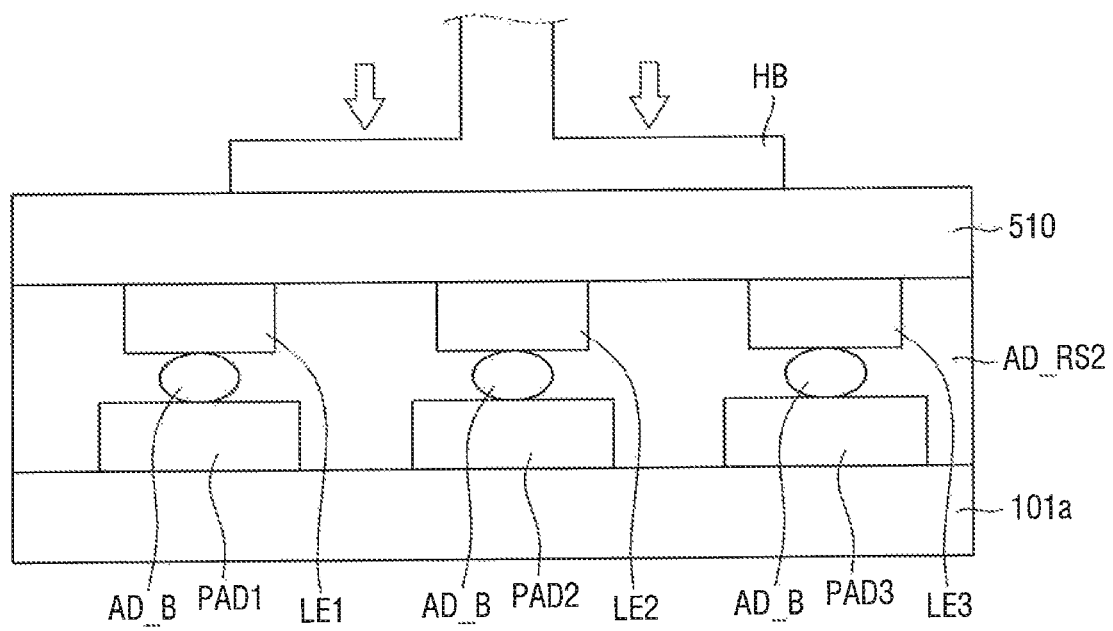

Referring to FIG. 21, after the jetting process is completed, the base film 510 may be vertically inverted and thermally pressed to the first substrate 101a by a pressing member. The thermal pressing process may be performed in a manner substantially the same as or similar to that in FIG. 15. The filling member AD_RS2 may be thermally cured by the thermal pressing process so that bonding between the printed circuit board 500 and the display panel 100 may be completed.

A display device and a display device manufacturing method according to an embodiment of the present invention can prevent a short circuit caused by a flow of conductive particles.

Effects according to the embodiments of the present invention are not limited by the content exemplified above, and more various effects are included in the present invention.

While the present invention has been described with reference to the embodiments thereof, it will be understood by those of ordinary skill in the art that various changes in form and detail may be made thereto without departing from the spirit and scope of the present invention.

What is claimed is:

1. A display device comprising:
a display panel including a plurality of pad electrodes arranged in a first direction;
a printed circuit board including a plurality of lead electrodes facing the plurality of pad electrodes, respectively;
a plurality of conductive particles disposed between the display panel and the printed circuit board at predetermined intervals;
a coating layer disposed on the plurality of conductive particles and having a thickness varying in the first direction from each of the plurality of lead electrodes toward each of the plurality of pad electrodes; and
a filling member disposed on the coating layer and including an insulating material, wherein the coating layer is disposed between the plurality of conductive particles and the filling member.

2. The display device of claim 1, wherein:
the plurality of pad electrodes are disposed to be spaced apart from each other by a first pitch in the first direction, and
the plurality of conductive particles are disposed only on the plurality of pad electrodes and are spaced apart from each other by a first distance substantially equal to the first pitch, and wherein the plurality of conductive particles are spaced apart from each other by a second distance in a second direction intersecting the first direction.

3. The display device of claim 2, wherein the plurality of conductive particles are spaced apart from edges of each of the plurality of pad electrodes in the first direction and the second direction.

4. The display device of claim 1, wherein the coating layer includes a thermosetting acrylic resin.

5. The display device of claim 1, wherein the coating layer includes at least one of lead or tin.

6. The display device of claim 1, wherein the thickness of the coating layer disposed on the plurality of conductive particles increases from each of the plurality of lead electrodes toward each of the plurality of pad electrodes.

7. The display device of claim 1, wherein the thickness of the coating layer disposed on the plurality of conductive particles decreases from each of the plurality of lead electrodes toward each of the plurality of pad electrodes.

8. The display device of claim 1, wherein the filling member is disposed between the plurality of conductive particles.

9. The display device of claim 8, further comprising a flux layer interposed between the coating layer and the filling member.

10. The display device of claim 1, wherein each of the plurality of conductive particles includes a polymer material and at least one metal layer at least partially surrounding the polymer material.

11. A display device comprising:
a display panel including a plurality of pad electrodes arranged in a first direction;
a printed circuit board including a plurality of lead electrodes facing the plurality of pad electrodes, respectively;
a plurality of conductive particles disposed between the display panel and the printed circuit board at predetermined intervals; and
a coating layer disposed on the plurality of conductive particles and having a thickness varying in the first direction from each of the plurality of lead electrodes toward each of the plurality of pad electrodes, wherein a plurality of protrusions are formed on an outer surface of each of the plurality of conductive particles.

12. An electronic device, comprising:
a display device comprising:
a display panel including a plurality of pad electrodes arranged in a first direction;
a printed circuit board including a plurality of lead electrodes facing the plurality of pad electrodes, respectively;
a plurality of conductive particles disposed between the display panel and the printed circuit board at predetermined intervals;
a coating layer disposed on the plurality of conductive particles and having a thickness varying in the first direction from each of the plurality of lead electrodes toward each of the plurality of pad electrodes; and a filling member disposed on the coating layer and including an insulating material, wherein the coating layer is disposed between the plurality of conductive particles and the filling member.

13. The electronic device of claim 12, wherein:

the plurality of pad electrodes are disposed to be spaced apart from each other by a first pitch in the first direction, and the plurality of conductive particles are disposed only on the plurality of pad electrodes and are spaced apart from each other by a first distance substantially equal to the first pitch, and wherein the plurality of conductive particles are spaced apart from each other by a second distance in a second direction intersecting the first direction.

14. The electronic device of claim 12, wherein the coating layer directly contacts the plurality of lead electrodes.

15. The electronic device of claim 12, wherein the filling member is disposed between the plurality of lead electrodes.

\* \* \* \* \*